US008560677B2

(12) United States Patent
VanGilder et al.

(10) Patent No.: US 8,560,677 B2
(45) Date of Patent: Oct. 15, 2013

(54) DATA CENTER CONTROL

(75) Inventors: James W. VanGilder, Pepperell, MA (US); Mikkel Dalgas, Hejls (DK); Xuanhang Zhang, Tewksbury, MA (US)

(73) Assignee: Schneider Electric IT Corporation, West Kingston, RI (US)

( * ) Notice: Subject to any disclaimer, the term of this patent is extended or adjusted under 35 U.S.C. 154(b) by 293 days.

(21) Appl. No.: 12/888,053

(22) Filed: Sep. 22, 2010

(65) Prior Publication Data
US 2011/0077795 A1    Mar. 31, 2011

Related U.S. Application Data

(63) Continuation-in-part of application No. 12/371,355, filed on Feb. 13, 2009.

(51) Int. Cl.
G06F 15/173 (2006.01)
G05D 23/00 (2006.01)

(52) U.S. Cl.
USPC .......................................... 709/224; 700/300

(58) Field of Classification Search
USPC .......................................... 709/224; 700/300
See application file for complete search history.

(56) References Cited

U.S. PATENT DOCUMENTS

| | | | |
|---|---|---|---|
| 4,747,041 A | 5/1988 | Engel et al. |
| 4,823,290 A | 4/1989 | Fasack et al. |
| 5,019,717 A | 5/1991 | McCurry et al. |
| 5,097,328 A | 3/1992 | Boyette |
| 5,153,837 A | 10/1992 | Shaffer et al. |
| 5,216,623 A | 6/1993 | Barrett et al. |
| 5,367,670 A | 11/1994 | Ward et al. |
| 5,381,554 A | 1/1995 | Langer et al. |
| 5,382,943 A | 1/1995 | Tanaka |
| 5,404,136 A | 4/1995 | Marsden |
| 5,462,225 A | 10/1995 | Massara et al. |
| 5,528,507 A | 6/1996 | McNamara et al. |
| 5,682,949 A | 11/1997 | Ratcliffe et al. |
| 5,845,090 A | 12/1998 | Collins, III et al. |
| 5,860,012 A | 1/1999 | Luu |
| 5,949,974 A | 9/1999 | Ewing et al. |
| 5,960,204 A | 9/1999 | Yinger et al. |
| 5,963,457 A | 10/1999 | Kanoi et al. |
| 5,974,237 A | 10/1999 | Shurmer et al. |
| 5,978,594 A | 11/1999 | Bonnell et al. |
| 5,978,912 A | 11/1999 | Rakavy et al. |

(Continued)

OTHER PUBLICATIONS

Banerjee et al. Cooling-Aware and Thermal-Aware Workload Placement for Green HPC Data Centers. Aug. 2010. IEEE.*

(Continued)

*Primary Examiner* — Lynn Feild
*Assistant Examiner* — Bryan Lee
(74) *Attorney, Agent, or Firm* — Lando & Anastasi, LLP

(57) ABSTRACT

Systems and methods for data center control are provided. The data center includes a plurality of racks and at least one cooling unit. The racks including at least one server. Information regarding the at least one cooling unit, the at least one server, the plurality of racks, and at least one application is received. A rack based cooling metric threshold is also received. The systems and methods can determine a layout of the data center that minimizes total power consumption of the plurality of racks and the cooling unit while maintaining cooling performance at an acceptable level based on the threshold.

20 Claims, 11 Drawing Sheets

(56) References Cited

U.S. PATENT DOCUMENTS

| | | | |
|---|---|---|---|
| 5,987,614 A | 11/1999 | Mitchell et al. | |
| 5,995,729 A | 11/1999 | Hirosawa et al. | |
| 6,055,480 A | 4/2000 | Nevo et al. | |
| 6,085,243 A | 7/2000 | Fletcher et al. | |
| 6,104,868 A | 8/2000 | Peters et al. | |
| 6,105,061 A | 8/2000 | Nakai | |
| 6,108,782 A | 8/2000 | Fletcher et al. | |
| 6,112,235 A | 8/2000 | Spofford | |
| 6,141,762 A | 10/2000 | Nicol et al. | |
| 6,189,109 B1 | 2/2001 | Sheikh et al. | |
| 6,199,204 B1 | 3/2001 | Donohue | |
| 6,216,956 B1 | 4/2001 | Ehlers et al. | |
| 6,266,721 B1 | 7/2001 | Sheikh et al. | |
| 6,281,790 B1 | 8/2001 | Kimmel et al. | |
| 6,332,202 B1 | 12/2001 | Sheikh et al. | |
| 6,363,421 B2 | 3/2002 | Barker et al. | |
| 6,381,700 B1 | 4/2002 | Yoshida | |
| 6,389,464 B1 | 5/2002 | Krishnamurthy et al. | |
| 6,457,076 B1 | 9/2002 | Cheng et al. | |
| 6,574,104 B2 | 6/2003 | Patel et al. | |
| 6,714,977 B1 | 3/2004 | Fowler et al. | |
| 6,795,928 B2 | 9/2004 | Bradley et al. | |
| 6,829,630 B1 | 12/2004 | Pajak et al. | |
| 6,859,882 B2 | 2/2005 | Fung | |
| 6,964,539 B2 | 11/2005 | Bradley et al. | |
| 7,031,870 B2 | 4/2006 | Sharma et al. | |
| 7,032,119 B2 | 4/2006 | Fung | |
| 7,047,300 B1 | 5/2006 | Oehrke et al. | |
| 7,051,946 B2 | 5/2006 | Bash et al. | |
| 7,082,541 B2 | 7/2006 | Hammond et al. | |
| 7,120,689 B2 | 10/2006 | Gonsalves et al. | |
| 7,146,353 B2 | 12/2006 | Garg et al. | |
| 7,197,433 B2 | 3/2007 | Patel et al. | |
| 7,292,898 B2 | 11/2007 | Clark et al. | |
| 7,313,503 B2 | 12/2007 | Nakagawa et al. | |
| 7,426,453 B2 | 9/2008 | Patel et al. | |
| 7,472,043 B1 | 12/2008 | Low et al. | |
| 7,596,476 B2 | 9/2009 | Rasmussen et al. | |
| 7,620,480 B2 | 11/2009 | Patel et al. | |
| 2001/0005894 A1 | 6/2001 | Fukui | |
| 2001/0047213 A1 | 11/2001 | Sepe, Jr. | |
| 2001/0047387 A1 | 11/2001 | Brockhurst | |
| 2001/0047410 A1 | 11/2001 | Defosse | |
| 2001/0052006 A1 | 12/2001 | Barker et al. | |
| 2001/0055965 A1 | 12/2001 | Delp et al. | |
| 2002/0004912 A1 | 1/2002 | Fung | |
| 2002/0023258 A1 | 2/2002 | Elwahab et al. | |
| 2002/0043969 A1 | 4/2002 | Duncan et al. | |
| 2002/0055909 A1 | 5/2002 | Fung et al. | |
| 2002/0062454 A1 | 5/2002 | Fung | |
| 2002/0071031 A1 | 6/2002 | Lord et al. | |
| 2002/0072868 A1 | 6/2002 | Bartone et al. | |
| 2002/0112054 A1 | 8/2002 | Hatanaka | |
| 2002/0124081 A1 | 9/2002 | Primm et al. | |
| 2002/0129355 A1 | 9/2002 | Velten et al. | |
| 2002/0161885 A1 | 10/2002 | Childers et al. | |
| 2003/0033550 A1 | 2/2003 | Kuiawa et al. | |
| 2003/0084357 A1 | 5/2003 | Bresniker et al. | |
| 2003/0084358 A1 | 5/2003 | Bresniker et al. | |
| 2003/0084359 A1 | 5/2003 | Bresniker et al. | |
| 2003/0115024 A1 | 6/2003 | Snevely | |
| 2003/0120780 A1 | 6/2003 | Zhu et al. | |
| 2003/0154285 A1 | 8/2003 | Berglund et al. | |
| 2003/0158718 A1 | 8/2003 | Nakagawa et al. | |
| 2003/0188208 A1 | 10/2003 | Fung | |
| 2003/0193777 A1 | 10/2003 | Friedrich et al. | |
| 2003/0196126 A1 | 10/2003 | Fung | |
| 2003/0200130 A1 | 10/2003 | Kall et al. | |
| 2003/0200295 A1 | 10/2003 | Roberts et al. | |
| 2003/0200473 A1 | 10/2003 | Fung | |
| 2003/0204756 A1 | 10/2003 | Ransom et al. | |
| 2003/0236822 A1 | 12/2003 | Graupner et al. | |
| 2004/0003266 A1 | 1/2004 | Moshir et al. | |
| 2004/0010569 A1 | 1/2004 | Thomas et al. | |
| 2004/0073597 A1 | 4/2004 | Caveney et al. | |
| 2004/0075343 A1 | 4/2004 | Wareham et al. | |
| 2004/0078708 A1 | 4/2004 | Li et al. | |
| 2004/0163001 A1 | 8/2004 | Bodas | |
| 2004/0186905 A1 | 9/2004 | Young et al. | |
| 2004/0230848 A1 | 11/2004 | Mayo et al. | |
| 2004/0240514 A1 | 12/2004 | Bash et al. | |
| 2005/0023363 A1 | 2/2005 | Sharma et al. | |
| 2005/0055590 A1 | 3/2005 | Farkas et al. | |
| 2005/0071699 A1 | 3/2005 | Hammond et al. | |
| 2005/0108582 A1 | 5/2005 | Fung | |
| 2005/0114507 A1 | 5/2005 | Tarui et al. | |
| 2005/0177755 A1 | 8/2005 | Fung | |
| 2005/0185654 A1 | 8/2005 | Zakikian et al. | |
| 2005/0198247 A1 | 9/2005 | Perry et al. | |
| 2005/0228618 A1 * | 10/2005 | Patel et al. | 702/188 |
| 2005/0246431 A1 | 11/2005 | Spitaels | |
| 2005/0251802 A1 | 11/2005 | Bozek et al. | |
| 2006/0072262 A1 | 4/2006 | Paik et al. | |
| 2006/0112286 A1 | 5/2006 | Whalley et al. | |
| 2006/0203834 A1 | 9/2006 | Augustinus | |
| 2007/0078635 A1 * | 4/2007 | Rasmussen et al. | 703/1 |
| 2007/0088822 A1 | 4/2007 | Coile et al. | |
| 2007/0150215 A1 | 6/2007 | Spitaels et al. | |
| 2007/0150584 A1 | 6/2007 | Srinivasan | |
| 2007/0174024 A1 | 7/2007 | Rasmussen et al. | |
| 2007/0271475 A1 | 11/2007 | Hatasaki et al. | |
| 2008/0104587 A1 | 5/2008 | Magenheimer et al. | |
| 2008/0174954 A1 * | 7/2008 | VanGilder et al. | 361/687 |
| 2008/0177424 A1 | 7/2008 | Wheeler | |
| 2008/0229318 A1 | 9/2008 | Franke | |
| 2008/0317021 A1 * | 12/2008 | Ives et al. | 370/389 |
| 2009/0106409 A1 | 4/2009 | Murata | |
| 2009/0121547 A1 | 5/2009 | Paik et al. | |
| 2009/0138313 A1 | 5/2009 | Morgan et al. | |
| 2009/0204826 A1 | 8/2009 | Cox et al. | |
| 2009/0228893 A1 * | 9/2009 | Behrendt et al. | 718/105 |
| 2009/0259345 A1 * | 10/2009 | Kato et al. | 700/295 |
| 2009/0276771 A1 | 11/2009 | Nickolov et al. | |
| 2010/0131957 A1 | 5/2010 | Kami | |
| 2010/0191854 A1 | 7/2010 | Isci et al. | |
| 2010/0211669 A1 | 8/2010 | Dalgas | |
| 2010/0211810 A1 | 8/2010 | Zacho | |
| 2011/0078474 A1 | 3/2011 | Hatasaki et al. | |
| 2011/0099403 A1 | 4/2011 | Miyata et al. | |

OTHER PUBLICATIONS

VanGilder et al. Capture Index: An Airflow-Based Rack Cooling Performance Metric. 2007. ASHRAE.*

International Search Report and Written Opinion from corresponding International Application No. PCT/US2010/022074, dated Jul. 27, 2010.

International Search Report for PCT/US2010/023142, mailed May 11, 2010.

Pinheiro, Eduardo, "Load Balancing and Unbalancing for Power and Performance in Cluster-Based Systems," Internet Citation, May 1, 2001 URL:http://research.ac.upc.es/pact01/colp/paper04.pdf, retrieved on Nov. 17, 2003.

International Preliminary Report on Patentability and Written Opinion from PCT/US2010/023142 dated Aug. 16, 2011.

* cited by examiner

DATA CENTER CONTROL

CROSS REFERENCE TO RELATED APPLICATIONS

This application is a continuation in part of, and claims the benefit under 35 U.S.C. §120 of U.S. application Ser. No. 12/371,355, entitled "Data Center Control," filed on Feb. 13, 2009, which is hereby incorporated herein by reference in its entirety. This application further hereby incorporates herein by reference, in its entirety, U.S. patent application Ser. No. 12/370,969 entitled "Power Supply and Data Center Control," filed on Feb. 13, 2009, and assigned to the assignee of the present application. The referenced applications generally disclose systems and methods for controlling data centers.

BACKGROUND OF THE INVENTION

1. Field of the Invention

At least one embodiment of the present invention relates generally to controlling facility activity, and more specifically, to managing data centers.

2. Background of the Invention

In response to increasing demands of industrial, developing, and information based economies, data centers and information technology networks continue to proliferate across the globe. This expansion has taken on various forms, including widely distributed computer networks that link together geographically disparate computing resources, as well as data centers, which provide power, cooling, and computing infrastructure to a variety of applications.

Typical data centers contain a number of racks of equipment that require power, cooling, and connections to external communications facilities. In modern data centers and network rooms, the increased density of computing equipment used in these facilities has put strains on their associated power systems. Because this computing equipment generates heat in operation, the cooling systems of these facilities are strained as well.

As the type, size, and complexity of data centers grow, so do the costs associated with their operation. These costs include energy cost associated with power usage, the cost for acquiring electronic devices and infrastructure, the cost of associated cooling or heat dissipation systems, and the salary of maintenance and administration staff.

SUMMARY OF THE INVENTION

Aspects and embodiments of the present invention are directed to systems and methods of data center control. Data center layouts can be determined or modified, and resources can be allocated or reallocated to minimize total power consumption of the data center based on rack power consumption or cooling unit power consumption of data center components.

At least one aspect is directed to a computer implemented method of data center control. The data center includes a plurality of racks and at least one cooling unit. The racks include at least one server. The method includes an act of receiving information regarding the at least one cooling unit, the at least one server, the plurality of racks, and at least one application. The method also receives a rack based cooling metric threshold and determines a layout of the data center that minimizes total power consumption of the plurality of racks and the cooling unit while maintaining cooling performance at an acceptable level based on the threshold.

At least one other aspect is directed to a data center control system of a data center including a plurality of racks and at least one cooling unit. The racks include at least one server. The control system includes a data center controller that can receive information regarding the at least one cooling unit, the at least one server, the plurality of racks, and at least one application. The data center controller can also receive a rack based cooling metric threshold, and can determine a layout of the data center. The layout minimizes total power consumption of the plurality of racks and the cooling unit while maintaining cooling performance at an acceptable level based on the threshold.

At least one other aspect is directed to a computer readable medium having stored thereon sequences of instruction. The instructions cause a processor to receive information regarding at least one cooling unit, server, plurality of racks, and application. The instructions cause the processor to receive a rack based cooling metric threshold and to determine a layout of the data center that minimizes total power consumption of the plurality of racks and the cooling unit while maintaining cooling performance at an acceptable level based on the threshold.

In various embodiments, a workload distribution of the at least one application between a plurality of servers is determined. The workload distribution satisfies the rack based cooling metric threshold. The rack based cooling metric threshold can include at least one of a hot aisle capture index threshold and a cold aisle capture index threshold, which can be determined in real time. The application can be distributed to the at least one server based on at least one of the hot aisle capture index threshold and the cold aisle capture index threshold.

In some embodiments, individual power consumption of each of the plurality of racks can be determined based on a workload utilization rate of each of the plurality of racks. Power consumption of the at least one cooling unit can also be determined based on a cooling utilization rate of the at least one cooling unit, and total power consumption of the plurality of racks and of the at least one cooling unit can be determined. The layout of the data center can be determined based on the total power consumption, the power consumption of each of the plurality of racks, and the power consumption of the at least one cooling unit.

In some embodiment, total power consumption of the data center can be determined in real time based on at least one of a workload utilization rate of the rack and a cooling utilization rate of the cooling unit. Workload can be distributed between a plurality of servers and cooling load between a plurality of cooling units while maintaining cooling performance at the acceptable level based on the threshold. The application can be distributed from one server to a second server of a second rack. The second rack can located the same data center as the first server or a different data center.

Instructions can be provided to relocate the rack within the data center, or to display the layout of the data center. In some embodiments, the layout of the data center is an initial layout, and the data center controller can distribute workload from a first server to a second server and can determine a second layout of the data center.

In various embodiments, the rack based cooling metric threshold includes a hot aisle capture index threshold or a cold aisle capture index threshold, and the data center controller can determine the hot aisle capture index threshold or the cold aisle capture index threshold, and can distribute the application to the server based on the hot aisle capture index threshold or the cold aisle capture index threshold. The data center controller can also determine individual power consumption of each of the plurality of racks based on a workload utilization rate of each of the plurality of racks and can determine power consumption of the at least one cooling unit based on a cooling utilization rate of the at least one cooling unit. The data center controller can also determine total power consumption of the plurality of racks and of the at least one cooling unit, and determine the layout of the data center based on the total power consumption, the power consumption of each of the plurality of racks, and the power consumption of the at least one cooling unit.

In some embodiments, the data center controller can determine total power consumption of a cluster of the data center, the cluster including the plurality of racks and the at least one cooling unit, and can identify a workload distribution of the cluster that minimizes the total power consumption. In one embodiment, the data center controller can determine total power consumption of the data center. This determination can be based on a workload utilization rate of the plurality of racks or a cooling utilization rate of the cooling unit, and the data center controller can distribute workload between a plurality of servers while maintaining cooling performance at the acceptable level based on the threshold. The data center controller can also transfer the at least one application from the at least one server to a second server. The cooling can includes an in-row cooling unit, or a room based cooling unit.

Other aspects, embodiments, and advantages of these exemplary aspects and embodiments will become apparent from the following detailed description, taken in conjunction with the accompanying drawings, illustrating the principles of the invention by way of example only. The foregoing information and the following detailed description include illustrative examples of various aspects and embodiments, and are intended to provide an overview or framework for understanding the nature and character of the claimed aspects and embodiments. The drawings, together with the remainder of the specification, serve to explain the described and claimed aspects and embodiments.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. The foregoing and other objects, features, and advantages of the systems and methods disclosed herein will be more fully understood from the following description of various embodiments, when read together with the accompanying drawings, in which.

DETAILED DESCRIPTION

Figure 1:
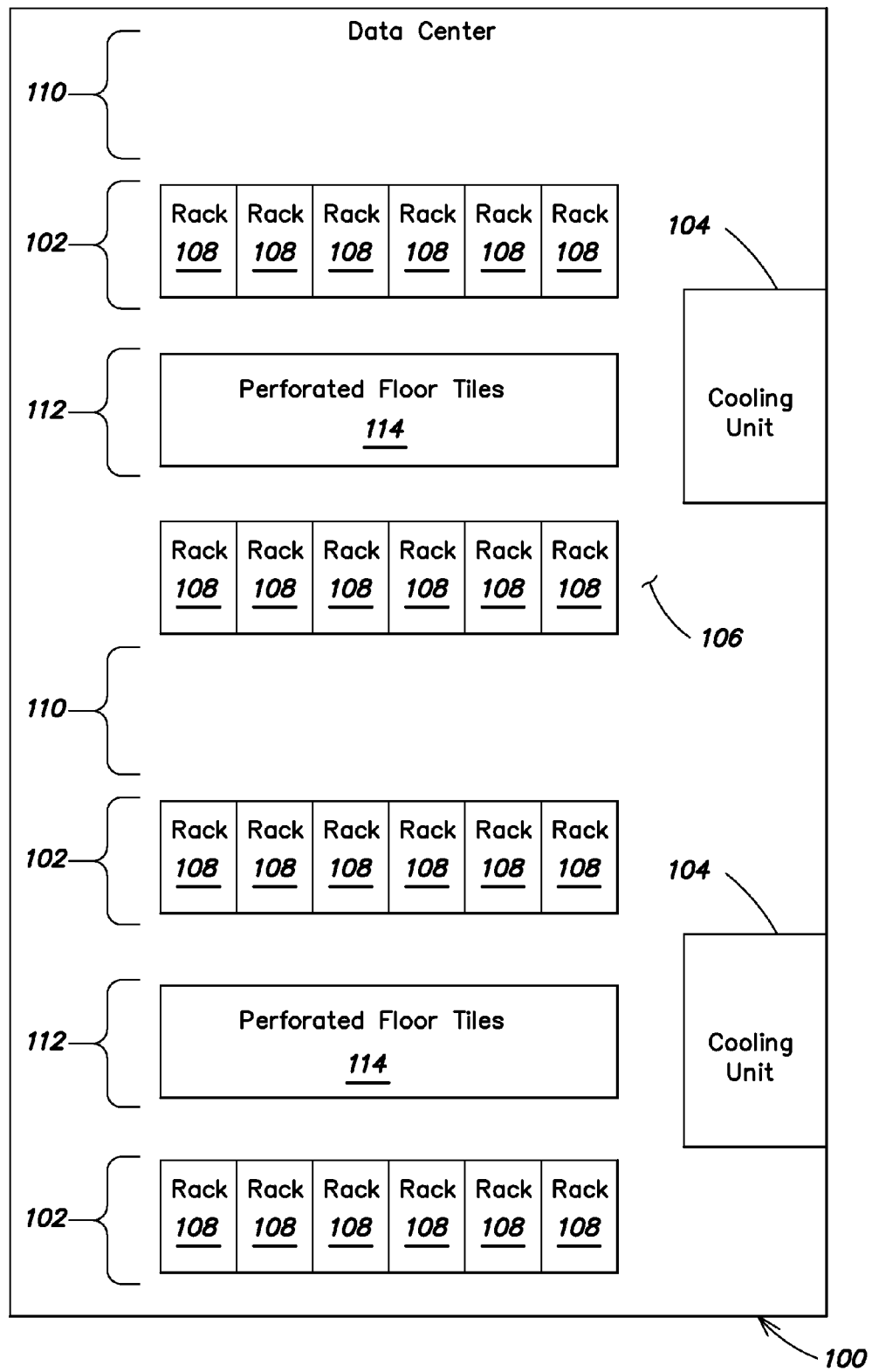
FIG. 1 is a top view depicting an example of a data center in accordance with an embodiment.

The systems and methods described herein are not limited in their application to the details of construction and the arrangement of components set forth in the description or illustrated in the drawings. The invention is capable of other embodiments and of being practiced or of being carried out in various ways. Also, the phraseology and terminology used herein is for the purpose of description and should not be regarded as limiting. The use of "including" "comprising" "having" "containing" "involving" and variations thereof herein, is meant to encompass the items listed thereafter and equivalents thereof as well as additional items.

Various aspects and embodiments are directed to data center control. Characteristics of one or more data centers can be identified, monitored, and controlled by one or more data center controllers via a network. The data centers can be geographically disparate, and can have different characteristics and components. Data center controllers can evaluate characteristics of the data centers and applications that can be executed by data center components. These evaluations can include, for example, assessments of data center supply, (e.g., available data center processing or cooling capacity) or demand (e.g., parameters of applications that may be provided by data centers for execution). Based at least in part on these evaluations, a data center controller can direct an application to one or more data centers for execution.

Embodiments described herein may be used to design, manage and retrofit a data center, such as data center 100, which is illustrated in FIG. 1. Data center 100 may include various resources, equipment, or devices that support or ensure data center equipment functionality. Examples of data center 100 resources include power, cooling, physical space, weight support, remote equipment control capability, physical and logical security and physical and logical network connectivity. Power data center resources may include power distribution resources, such as transformers, power distribution units, outlets, and power available for distribution, such as utility power supplied to data center 100, power generated by an onsite generator and power supplied by power distribution units. Physical space resources in data center 100 may include data center floor space and rack U space. Cooling resources in data center 100 may include cooling distribution capacity and cooling generation capacity. Physical security resources in data center 100 may include security cameras and door locks. Logical network connectivity resources in data center 100 may include Virtual Local Area Networks, Domain Name Services, and Dynamic Host Configuration Protocol Services. Physical network connectivity resources may include network cabling and patch panels. Remote equipment control capability resources in data center 100 may include Keyboard Video Mouse services.

Data center 100 is a representative data center and various embodiments described herein are not limited to data centers such as data center 100. Various other data centers and facilities may be used that, for example, do not include raised floors. Data center 100 or other data centers may be used with facilities that house more, less, or different equipment, or equipment other than computing equipment, including telecommunications facilities and other facilities. In one embodiment, data center 100 includes a computer supported by a subsystem. Data center 100 may, but need not be a dedicated space or room. Further, data center equipment layouts need not be neatly arranged as illustrated in FIG. 1.

Data center 100 can include rows 102, cooling units 104, and at least one raised floor 106. Rows 102 can include at least one rack 108, which in operation can draw cool air from the front of rack 108 and return warm air to the rear or top of rack 108. In one embodiment, rack 108 may contain U space positions designed to house rack mounted data center equipment, such as, for example, servers, computers, cooling equipment, or network connectivity equipment.

In one embodiment, rows 102 of data center 100 can be positioned to create alternating cold aisles and hot aisles. As illustrated in the embodiment of FIG. 1, aisles 110 are hot aisles and aisles 112 are cold aisles. To provide cooling to racks 108, in front of each rack 108 in cold aisle 112, perforated floor tiles 114 can be used to provide cooling air from under raised floor 106. In data center 100, in addition to the perforated floor tiles 114, raised floor 106 may include solid floor tiles. Cooling units 104 can provide cool air to the area under raised floor 106 and can receive warm air from a space adjacent the ceiling of the data center. Cooling units 104 can also exhaust cool air toward the ceiling of the data center, and intake warm air from the floor of the data center.

In one embodiment, in addition to or in place of cooling units 104, in-row cooling units, such as those available from American Power Conversion (APC) Corporation of West Kingston, R.I. may be used. In one embodiment, half-rack in-row cooling units may be used with, for example, a width of twelve inches, which is approximately half of that of a standard data center rack.

Data centers 100 may include a plurality of different types of servers. For example, a server may be a physical server, a dedicated server, or a virtual server. A physical server generally includes hardware where an operating system is run. A dedicated server generally includes a service application running on a physical server. For example, a dedicated server may include a web service or file transfer protocol (FTP) service on an operating system, where the service application can be coupled to the physical server. A virtual server can include a service that is independent of physical server hardware. For example, a virtual server may include a partitioning of a physical server into multiple servers, each having the appearance and capabilities as if they were running on their own dedicated server. In one embodiment, there can be one dedicated server operating system per physical server and multiple virtual servers per physical server. A virtual server can run concurrent with (e.g., on top of) a dedicated server. A plurality of servers or racks 108 may form a cluster to collectively run applications or programs. The cluster can have at least one dedicated cooling unit 104, or multiple clusters can share the same cooling unit 104.

Figure 2:
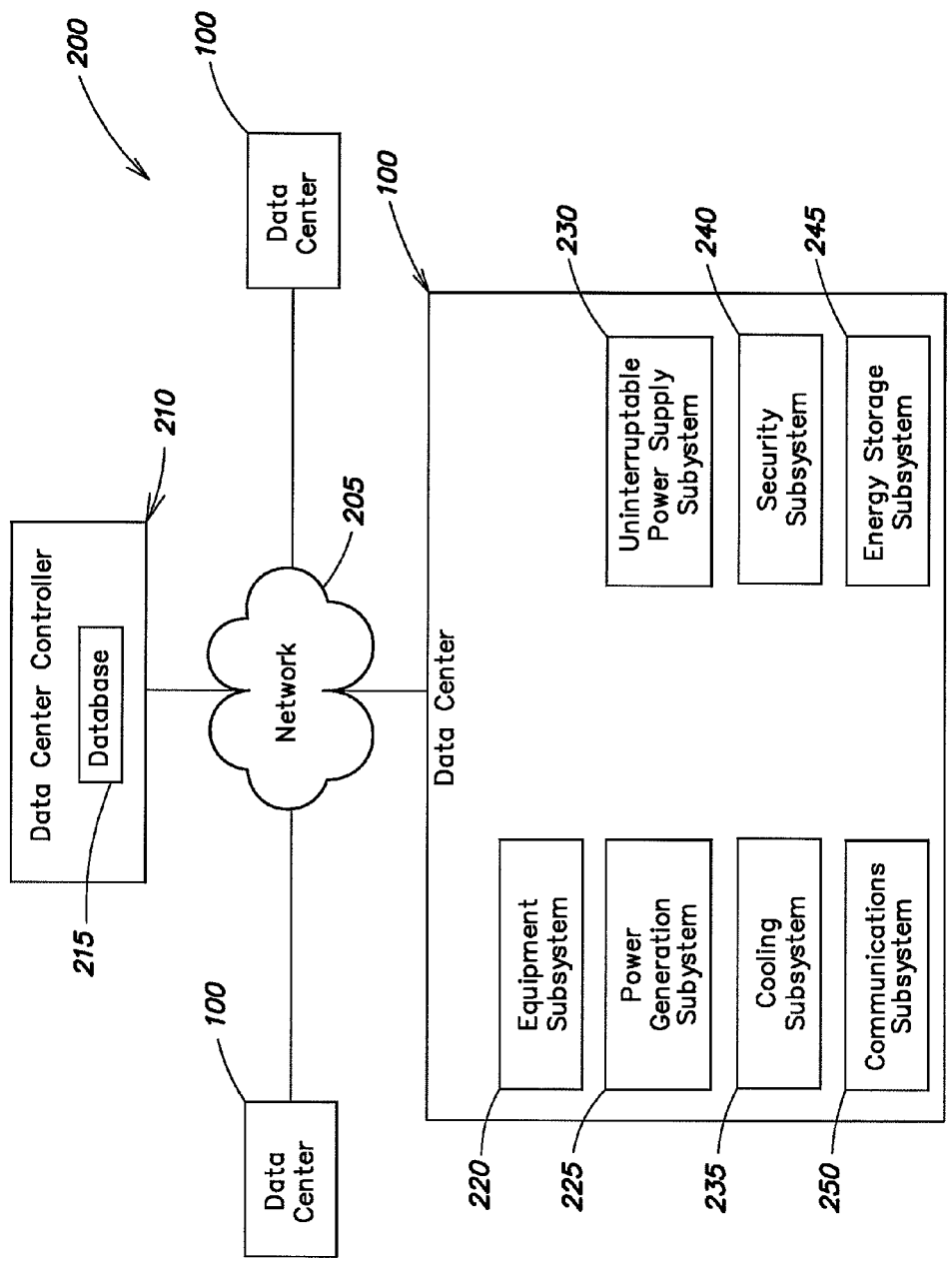
FIG. 2 is a block diagram depicting an example of a data center control system in accordance with an embodiment.

FIG. 2 is a block diagram of a data center control system 200 in accordance with an embodiment. In one embodiment, system 200 includes at least one data center 100. A plurality of data centers 100 can be associated with each other via at least one network 205 and at least one data center controller 210. Network 205 can include at least one network of interconnected computers such as the Internet, any wide, local, metro, wireless, telephone, cellular, satellite, or other area networks, or combinations thereof. Network 205 may include network infrastructure equipment such as servers, routers, nodes, or switches, for example. In one embodiment, data center 100 components interconnect with each other or with data center controller 210 via at least one network 205. Servers in data center 100 and network infrastructure devices of network 205 may be grouped into network zones or clusters so that network 205 security remains intact during and after server additions or changes.

In various embodiments, data center controller 210 can be located within one or more data centers 100, or remotely located external to data centers 100. For example, data center controller 210 may be located external to data center 100 and connected to data center 100 via network 205. In one embodiment data center controller 210 includes a device such as a processor, microchip, or circuit to identify, manage, and control data center characteristics. In one embodiment, data center controller 210 can receive data related to at least one data center 100. For example, data center controller 210 may receive, measure, or monitor data indicative of data center 100 temperature, capacity, power or current draw, or other data indicating an operational state of data center 100 or its components. In one embodiment, data center controller 210 can simulate data center 100 operation. Data center characteristics may be based on simulated or estimated—as opposed to measured—data center conditions such as temperature, capacity, or energy data. This simulated data may be either generated or received by data center controller 210.

Data center controller 210 may also contain data indicating maximum tolerances or capacities of data center 100. In one embodiment, at least one database 215 stores data indicating tolerances or maximum capacity of data center 100. Database 215 may be part of data center controller 210 or may be located elsewhere and accessible to data center controller 210 via, for example network 205. Database 215 may include data from more than one data center 100. In one embodiment, each data center 100 includes at least one database 215 that stores data indicating data center 100 information, such as tolerance or capacity ranges. Data center controller 210 in one embodiment may include an InfraStruXure® managing or designing platforms available from American Power Conversion Corporation® of West Kingston, R.I.

In one embodiment, data center controller 210 evaluates real-time or near real time data from one or more data centers 100. For example, data center controller 210 can determine if data center 100 is operating at capacity. Data center controller 210 can also determine or receive information indicating the operational state of individual devices, components, or subsystems of data center 100. For example, data center 100 may include a plurality of servers. Via network 205, data center 100 may provide data to data center controller 210 indicating that a particular server in data center 100 is not operating at capacity and therefore may be capable of executing additional applications.

In one embodiment, data center 100 includes one or more subsystems. Examples of subsystems include one or more equipment subsystems 220, power generation subsystems 225, uninterruptable power supply subsystems 230, cooling subsystems 235, security subsystems 240, energy storage subsystems 245, and communications subsystems 250. Subsystems generally include one or more data center 100 devices tasked with a function. For example, as illustrated in the embodiments of FIGS. 1 and 2, cooling subsystem 235 may include one or more cooling units 104 tasked with regulating data center 100 temperature. In another example, equipment subsystem 220 may include servers or other logic devices that perform computing functions.

In one embodiment, communications subsystem 250 includes computer hardware that provides data to at least one data center controller 210 via network 205. For example communications subsystem 250 may indicate that data center 100 is operating at 80% of its capacity based at least in part on, for example, a cooling capacity analysis performed on data center 100. In another example, communications subsystem 250 may indicate that a particular device, such as a server from equipment subsystem 220, is operating at 45% of its processing capacity. In this example, the server may be available for further processing operations. In one embodiment, communications subsystem 250 can provide to data center controller 210 maximum, minimum, or tolerance and operational data of data center 100, its associated subsystems, or individual data center components or devices. Communications subsystem 250 may also indicate that data center 100 has or does not have sufficient physical space for the insertion of additional components. In one embodiment, communications subsystem 250 includes at least one database 215.

Communications subsystem 250 may also indicate the status of data center 100 or its associated subsystems in general. For example, communication subsystem 250 may indicate that a power failure has occurred. A power failure may be due to a failure of the local power grid or a malfunction of a device or subsystem of data center 100, for example. Communications subsystem 250 may then provide information to data center controller 210 indicating that a power failure has occurred.

In one embodiment data center controller 210 continuously or periodically receives or monitors information about one or more data centers 100. From this information, data center controller 210 can determine the operational status, range, and tolerance of data centers 100 as a whole, as well as their individual devices (e.g., servers) or subsystems. Based at least in part on the received or monitored information, data center controller 210 may then reallocate applications between one or more data centers 100, identify one or more data centers 100 as a location to run an application, or identify a location in data center 100 as a location to add new hardware or a virtual server that can be used to run an application. In one embodiment, the received information includes simulated or estimated data center information.

For example, a first data center 100 may be operating at greater than 90% of its maximum cooling capacity. This information may be provided from communication subsystem 250 to data center controller 210. A second data center 100 may be operating at 30% of its maximum cooling capacity, and this information may be provided to data center controller 210 as well. In this example, data center controller 210, having identified the cooling capacity parameters of first and second data centers 100, may determine that second data center 100 can run an application that is currently run by first data center 100. Data center controller 210 may then instruct transfer of an application from first data center 100 to second data center 100. In this example, transferring an application from a first data center 100 to a second data center reduces first data center activity, which may lower the temperature of the first data center 100, and increase the available cooling capacity and available power capacity.

In one embodiment, data center controller 210 can identify one of data centers 100 as a location to execute a new application. For example, one or more data centers 100 may be operating at various capacities with respect to temperature, power, or other parameters. Data center controller 210 can evaluate the operating conditions of one or more data centers 100 to determine a data center 100 suited to execute a new application. In various embodiments, the determination can be based on any combination of temperature, power, current, cooling, energy, security or other data center 100 parameters such as location. For example, two data centers 100 may be drawing substantially the same amount of power, but may be located in different geographical locations. Data center controller 210 may identify one of these two data centers 100 as a location to execute the new application because, for example, data center controller 210 evaluates information indicating that energy costs at the second location are less than energy costs at the first location. In this example, both data centers 100 may be capable of executing the new application, however energy costs make data center 100 at the second location a more suitable location in this example.

Energy costs and other external factors need not be determinative when data center controller 210 identifies a location to run an application. Data center controller 210 may evaluate combinations of operational data (e.g., real time data), data center parameters (e.g., power consumption, cooling capacity, efficiency, reliability, redundancy, backup run time, tolerances of data centers 100, their subsystems, or individual components), as well as external factors, (e.g., local energy, security, or labor costs) of one or more data centers 100 to identify one or more data centers 100 as a location to run an application. Data center controller 210 may evaluate combinations of simulated data, such as simulated power consumption, simulated cooling capacity, simulated efficiency, simulated redundancy, and simulated backup run time of one or more data centers 100, their subsystems, or individual components.

Figure 3:
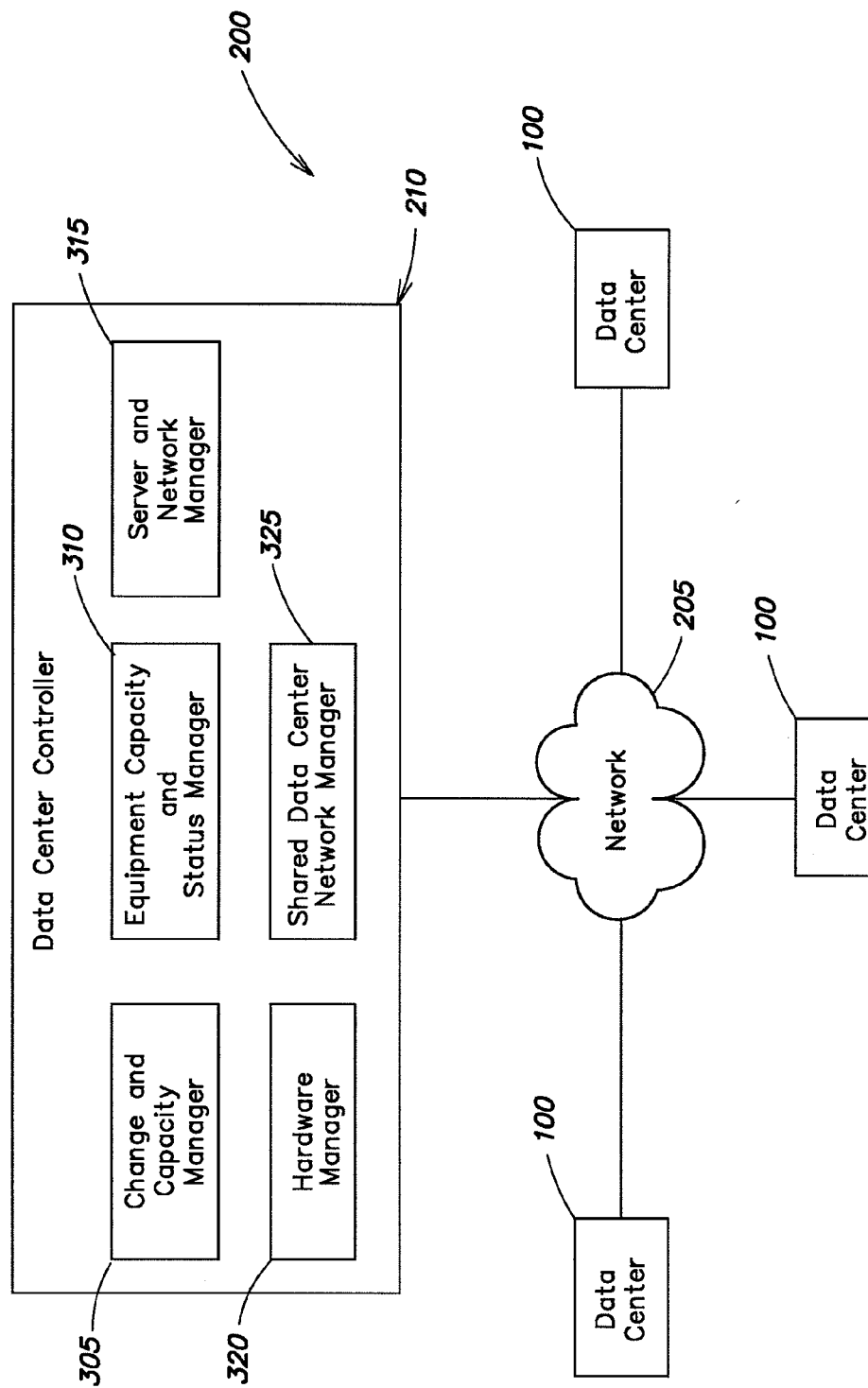
FIG. 3 is a block diagram depicting an example of a data center control system in accordance with an embodiment.

In FIG. 3 there is illustrated an example data center control system 200. In one embodiment, data center controller 210 provides an overview of data center 100 operation in real time, and during planned events such as routine maintenance, or unplanned events such as power outages or other unplanned disruptions. In one embodiment, data center controller 210 includes a change and capacity manager 305 that may determine data center 100 power and cooling characteristics as described in U.S. patent application Ser. No. 11/342,300 filed Jan. 27, 2006, entitled Methods and Systems for Managing Facility Power and Cooling, which is incorporated herein by reference in its entirety. Change and capacity manager 305 may determine the capacity of data centers 100. For example, change and capacity manager 305 may include a processor or logic device such as a circuit or microcontroller that identifies data center capacity. In one embodiment communications subsystem 250 provides to change and capacity manager 305 information regarding data center 100 capacity. For example, change and capacity manager 305 may indicate real time capacity of data center 100. A display may provide this information to a technician or person charged with data center 100 management.

At least one equipment capacity and status manager 310 can sample or monitor data center 100 equipment and determine an operational state (e.g., status) and operational range (e.g., capacity) of data center 100 equipment such as servers. For example, equipment capacity and status manager 310 may indicate that a virtual server in a particular rack of data center 100 is operating at 95% capacity. In another example, with reference to FIGS. 1 and 3, equipment capacity and status manager 310 may determine that cooling unit 104 is operating at 100% capacity, or that, for example, cooling unit 104 has been operating at greater than 90% capacity for a determined amount of time. In one embodiment, equipment and capacity manager 310 provides information to change and capacity manager 305 for further evaluation.

Data center controller 210 may also include at least one server and network manager 315, referred to for convenience as server manager 315. In one embodiment, server manager 315 manages and monitors performance criteria for physical, dedicated, or virtual servers located in data center 100. For example, server manager 315 may monitor server performance and determine that a server is operating at a certain percentage of its processing capacity. In one embodiment server manager 315 maintains and configures network equipment so that servers are located within a particular network, cluster, or zone. Server manager 315 may also indicate that a server is to be added to one or more data centers 100, removed from one or more data centers 100, or moved from one data center 100 to another data center 100.

In one embodiment, server manager 315 can include a redundant application running on multiple virtual servers. For example, an application may have a redundancy requirement for backup purposes. Examples of such applications include payroll, accounting, security, investment, banking, or other applications where an application failure is to be generally avoided. In this example, server manager 315 may identify and manage redundancy capabilities of one or more servers. In one embodiment, server manager 315 may run in one or more physical locations. Server manager 315 may also move between physical locations for example by operating on different servers.

In another example, server manager 315 may be implemented on dedicated hardware located in data center controller 210 or in data center 100. Further, server manager 315 may instruct that an application be provided to a particular server for execution in response to input from a technician, or at a particular time, for example. In one embodiment, server manager 315 can instruct that all or part of an application be moved from a first server to a second server. In this illustrative embodiment, first and second servers may be located in the same or different data centers 100. For example, server manager 315 may instruct that an application be distributed across a plurality of virtual servers located in more than one data center 100.

Data center controller 210 may also include at least one hardware manager 320. Hardware manager 320 generally optimizes data center 100 performance by monitoring equipment parameters, energy efficiency, total cost of ownership, maintenance, and disaster events to allocate resources in and between data centers 100. In one embodiment, hardware manager 320 unites the functionality of change and capacity manager 305 and server manager 315. For example, hardware manager 320 may evaluate information from change and capacity manager 305 and server manager 315 to provide instructions on where to locate a server. Factors considered by hardware manager 320 in identifying server locations in one or more data centers 100 include power grid outages, maintenance, environmental changes, local time, availability of on-site staff, increasing or decreasing utilization of data center 100. Other factors may be provided by change and capacity manager 305, equipment capacity and status manager 310, or server manager 315, for example.

In one embodiment, a technician may provide instructions to execute an application, or data center 100 operating requirements. For example, a technician may input parameters to hardware manager 320 instructing that no new physical servers are to be added to one or more data centers 100. In this example, hardware manager 320 may identify a virtual server location to execute an application. In another example, a technician may provide a maximum power draw for data center 100 due to an unreliable local power grid that supplies power to data center 100. In this example, hardware manager 320 may time shift or distribute applications to other data centers 100 to keep a power draw of data center 100 below a specified maximum power draw.

In one embodiment, hardware manager 320 provides instructions to move a server from a first location in a first data center 100 to a second location in the first or in a second data center 100. For example, hardware manager 320 may automatically move a server such as a virtual server from a first location in a first data center 100 to a second location in the first or a second data center 100. In one embodiment, based at least in part on data center 100 information, hardware manager 320 may move or provide instructions to move a server to a location in data center 100. Data center 100 information may include status and parameter information of data center components, total cost of ownership factors such as labor and energy costs, security, availability demands, and dynamic requirements such as power, cooling, extended runtime, and redundancy requirements. Hardware manager 320 may also identify reliability or other requirements of servers, network equipment, or other devices in data centers 100. Examples of these requirements include redundancy, runtime, power usage, processing speed or capacity, heat generation, security, power supply, power demand, and network zones associated with data center devices or applications. In one embodiment, hardware manager 320 can evaluate the nature of an application to be executed when identifying a location to execute the application within one or more of data centers 100.

In one embodiment, hardware manager 320 includes an application on a client platform in communication with one or more of change and capacity manager 305, equipment capacity and status manager 310, and server and network manager 315. For example, a hardware manager application may interact with one or more of managers 305 and 310 to identify data center 100 status and configuration information of servers located in data center 100. A hardware manager application may also identify network equipment forming part of network 205, total cost of ownership factors, and data center 100 power generation, storage, or cooling information.

In one embodiment, data center controller 210 includes at least one shared data center network manager 325. Shared data center network manager 325 may monitor demands and operations of one or more networks 205. For example, network 205 infrastructure or equipment may have operational limitations or functional requirements. Network infrastructure limitations, such as capacity, reliability or bandwidth, can be determined by network manager 325 and provided to hardware manager 320 or other data center controller 210 components as a factor that may be considered when identifying a location to execute an application.

Data center controller 210 need not include separate elements of change manager 305, equipment capacity and status manager 310, server manager 315, hardware manager 320, and shared data center network manager 325. Data center controller 210 may include other elements, such as one or more processors or circuits that can monitor parameters, requirements, and usage of data centers 100 and their components, including servers. In one embodiment, responsive to information received from data centers, data center controller 210 identifies at least one data center 100 as a location to execute an application. The application can be executed on existing equipment, or new equipment such as a virtual server can be added to data center 100 to execute the application.

In one embodiment, data center controller 210, including any combination of its subsystems and managers 305-325, can identify and track the physical location of servers. For example, data center controller 210 may be provided with information indicating that a particular server is located in a particular data center 100. Data center controller 210 may optimize the location of servers within data centers by evaluating server, data center 100, and network 205 information such as parameters, requirements, and operational status information. In one embodiment, data center controller 210 requests virtual, dedicated, or physical server movement, placement, addition, or relocation. This may be, for example, in response to application requirements, data center 100 operating conditions such as planned or unplanned service or maintenance, or network 205 operating conditions such as power grid outages. Requests for server movement may be responsive to power, cooling, or capacity operating conditions of data center 100. Server moves requested by data center controller 210 can increase data center 100 efficiency, reliability, and performance, and can reduce operational cost.

In one embodiment, data center controller 210 may identify a particular data center 100, or a particular rack 108 where a server is to be inserted. For example, data center controller 210 may identify an existing physical server in data center 100 and instruct that the existing physical server be modified to include a virtual or dedicated server. In one embodiment, data center controller 210 evaluates information from a plurality of data centers 100 and identifies a minimum number of virtual severs that can be used to execute one or more application or to perform one or more operation. This may include a cluster of virtual servers. In this illustrative embodiment, remaining data center 100 physical hardware can be shut down or put in a lower power standby mode. This conserves energy and reduces data center 100 cooling requirements.

In one embodiment, data center controller 210 provides an indication of power grid outages, data center 100 failures, or other disruptions. For example, data center controller 210 may identify a battery shutdown, warning, or other problem with data centers 100 or networks 205. Data center controller 120 may provide to a technician an indication of a data center 100 maintenance request.

In one example, data center 100 may be arranged in such a manner that cooling unit 104 is ineffective or inefficient. In this example, based on information received from data center 100 such as temperature data or cooling information, data center controller 210 may identify one or more servers (or other devices) that generate an undue amount of heat. Continuing with this example, data center controller 210 may identify a server for relocation nearer to cooling unit 104. Data center controller 210 may also identify a physical server as generating an inordinate amount of heat, and in response may transfer one or more virtual servers associated with that physical server to a different location in the same or a different data center 100.

Data center components may be evaluated to increase data center performance or operation. For example, data center controller 210 may identify an inefficiently operating server. In this example, data center controller 210 may identify a hardware or software upgrade. Data center controller 210 may then proceed to install or request an upgrade of the server.

In one embodiment, data center controller 210 may evaluate data center information to identify or determine available data center capacity. For example, data center controller 210 may identify available capacity of data center 100 as a whole, or of individual data center components such as servers or racks 108. Data center controller 210 may indicate that available data center capacity is available for lease, rent, or sale. In one embodiment, leasing of spare data center capacity takes place via a centralized data center capacity leasing system that can identify and indicate the availability of capacity in one or more data centers 100. In one embodiment, spare data center capacity may be distributed to one or more data centers 100 to increase data center 100 performance or to decrease cost. Data center controller 210 may also indicate a need for additional capacity to run an application, and may import or export data center capacity from one or more data centers 100. This additional capacity may function as a commodity. For example, like electricity and other energy resources, data center capacity can be sold, leased, or reserved.

Data center 100 may use a three phase power supply where uninterruptable power supply subsystem 230 includes a three phase uninterruptable power supply (UPS). In this example, the three phase UPS can distribute three phase power to power distribution units (PDUs) or circuit breaker panels of data center 100. From the PDUs, the power can be delivered to racks 108 via one or more single phase or three phase branch circuits. In this example, power utilization by data center devices, (e.g., subsystems, servers, or equipment) may be either single phase or three phase, and a server or other equipment may be unaware of the phase it is using. In one embodiment, data center controller 210 may monitor server reported power consumption values from a server of data center 100. In another embodiment, data center controller 210 monitors phase loading within a three phase power system of data center 100. With a three phase power system, data center controller 210 may be provided with phase specific information (e.g., the phase a server is connected to) in addition to any server reported power consumption information that indicates power consumption without specifying a phase.

In one embodiment, available unused UPS capacity of rack 108 may be determined. In another embodiment, where for example available unused capacity of a three phase UPS does not provide a sufficiently accurate indication of data center 100 power characteristics, the load of the individual phases at the UPS, at the PDU inputs, and at branch circuits may be determined. For example, in a three phase power distribution system, the power capacity measurement that most efficiently determines data center available capacity may be the branch circuit power capacity, (e.g., the point at which IT devices or other data center equipment connect to power). In this example, data center equipment may be single phase and connected to one of the three phases of a three phase UPS power system.

In one embodiment, in addition to the available power capacity at the branch circuit, data center controller 210 may also determine or be provided with available power capacity data of the corresponding phase at the UPS associated with the branch circuit, and with available power capacity data of the corresponding phase of the PDU associated with the branch circuit. In one embodiment, capacity at a branch circuit is available when capacity is available at the branch circuit itself, and its corresponding phase at both the PDU and the UPS associated with that branch circuit.

Capacity may become stranded between PDUs, UPSs, and branch circuits. Some data center 100 devices may have available capacity, but this available capacity may be inaccessible for use by other data center devices. For example, a cabinet such as one of equipment racks 108 may have no IT loads and may have a single phase branch circuit supplied by phase A of a three phase UPS, where the UPS is loaded to 33% with all of this load on phase A. In this example, there is no remaining UPS power for phase A and therefore there would be no available capacity for that rack 108. In this example, rack 108 could be rewired to supply the associated branch circuit from a different phase.

In another example, a rack 108 with no IT loads may have a single phase branch circuit supplied by phase A, where the associated PDU is loaded to 33% with all the load on phase A. In this example, there is no remaining PDU power for phase A and therefore no available capacity for rack 108. In this example, rack 108 could be rewired to supply the associated branch circuit from a different phase.

In another example, a rack 108 with three phase power distribution to the rack 108 rated at 15 kW may be loaded with equipment to a 9 kW capacity distributed equally across all three phases. In this example, each phase would have 2 kW of available capacity, as the power distribution is balanced across the three phases. In this example that, although it may appear that 6 kW of capacity is available, (i.e., 15 kW-9 kW,) due to the balanced distribution each phase has 2 kW of capacity, and in this example a device greater than 2 kW could not be installed in rack 108.

Data center equipment can be connected to 230V branch circuits. In North America three phase power distribution can connect loads such as data center equipment with either 120V or 208V. In one embodiment, 120V and 208V loads can be mixed on a branch circuit of data center 100. Both 120V and 230V loads can be associated with a particular phase, and 208V loads can be connected across two phases and can consume current capacity on both phases. Thus, in one embodiment where data center 100 draws power from a North American power grid, capacity at a branch circuit can be determined based on the availability of capacity at the branch circuit, and its associated UPS and PDU on both of the associated phases connected to the load.

In various embodiments, data center 100 control includes information related to both data center 100 power supply and data center 100 power demand. For example, data center controller 210 may manage information regarding the structure of data center 100 such as its power distribution system, its connection with IT loads such as data center equipment, and the associated phase of the connections.

In one embodiment, data center equipment, such as servers, may include instruments that allow for the reporting of server current and server power consumption information. Further, the physical location of data center equipment may be stored in a database associated with the equipment, or another database such as database 215.

In one embodiment power consumption of a rack 108 may be determined based on reported equipment and power consumption information of the equipment that a database indicates is located in the rack 108. For example, data center controller 210 may use this reported power consumption from server instrumentation of servers located in a rack 108 of data center 100 to determine cooling capacity for all or part of data center 100.

Server instruments that are built into some servers may provide insufficient information to indicate to data center controller 210 which branch circuit or phase it is connected to. In this example, without this information data center controller 210 may not be able to identify server or rack 108 available power capacity due, for example, to the stranded power capacity situations discussed herein. In this example, instruments may be introduced to data center 100 to provide information to data center controller 210.

In one embodiment, power consumption of a rack 108 or other data center equipment may be determined based at least in part on equipment manufacturer data. For example, when phase connections of equipment are known, branch circuit, UPS, and PDU capacities may be determined based at least in part on manufacturer supplied equipment parameters. To simplify these determinations, in one embodiment, branch circuits may be dedicated to a single data center device or piece of equipment, and branch circuit current loads may also be measured. In one embodiment, manufacturer data based power capacity determinations may be insufficient for some higher density data centers due, for example, to a high number of phase connections and branch circuit configurations where a branch circuit may be dedicated to a single device.

In one embodiment, instruments may be implemented throughout a power distribution system. For example instruments may be introduced into data center 100 with new devices, or existing data center equipment may be retrofitted.

In one embodiment, current can be measured at one or more branch circuits, PDU inputs, and UPS outputs of a power distribution system of data center 100 and this information can be provided to data center controller 210, which can quantify power demand of data center 100 based at least in part on this information. When, for example, data center controller 210 includes a logical representation of interconnections between racks 108, PDUs, and UPSs of data center 100, available power capacity that takes into account the phase loading effects can be determined for all branch circuits of data center 100.

As discussed, data center controller 210 may assist in the deployment of new data center equipment, devices, or IT equipment. In one embodiment, data center controller 210 may identify a location in data center 100 for placement of a device in a way that balances loads between the phases of a three phase power supply. When data center equipment is added to a data center, or moved within a data center, data center controller 210 may indicate that the equipment is to be coupled to underutilized phases of the power system serving data center 100. For example, equipment loads that operate at a power density above an average data center design density could be directed by data center controller 210 to be coupled to phases that are underutilized. Analogously, equipment loads that operate at a power density below an average data center design density could be directed by controller 210 to be coupled to phases that are over utilized. In one embodiment, repeating this phase-utilization based approach for devices added to or moved within data center 100 can optimize phase balance and rack 108 space utilization.

A failure to deploy data center equipment in a balanced manner can lead to stranded power capacity that appears to be present in some data center equipment, such as a PDU, branch circuit, or UPS, but that cannot be utilized due to the configuration of the data center equipment or power system, thus reducing data center 100 efficiency and the amount of equipment that can be deployed.

Balancing the phase utilization of a three phase power supply can effect rack 108 power distribution and data center 100 power density. In one embodiment, data center controller 210 can identify zones of equipment enclosures within data centers 100. For example, row 102 may be a zone of data center 100. In this example, data center controller 210 may determine or specify the average rack power or peak to average rack ratio for each zone. Continuing with this example, the peak to average ratio may impact the amount of stranded power capacity that can exist. In one embodiment, data center controller 210 may increase the peak to average ratio to a value 20% larger than the value expected from typical rack 108 variations. This can reduce the amount of stranded power capacity due to imbalances between branch circuits.

In one embodiment, three phase power distribution to a rack 108 enables data center controller 210 to assign equipment to different phases of that rack 108, resulting in a balanced application of power phases. In an embodiment with single phase power distribution to a rack 108, data center controller 210 may direct relocation of branch circuits between racks 108.

Figure 4:
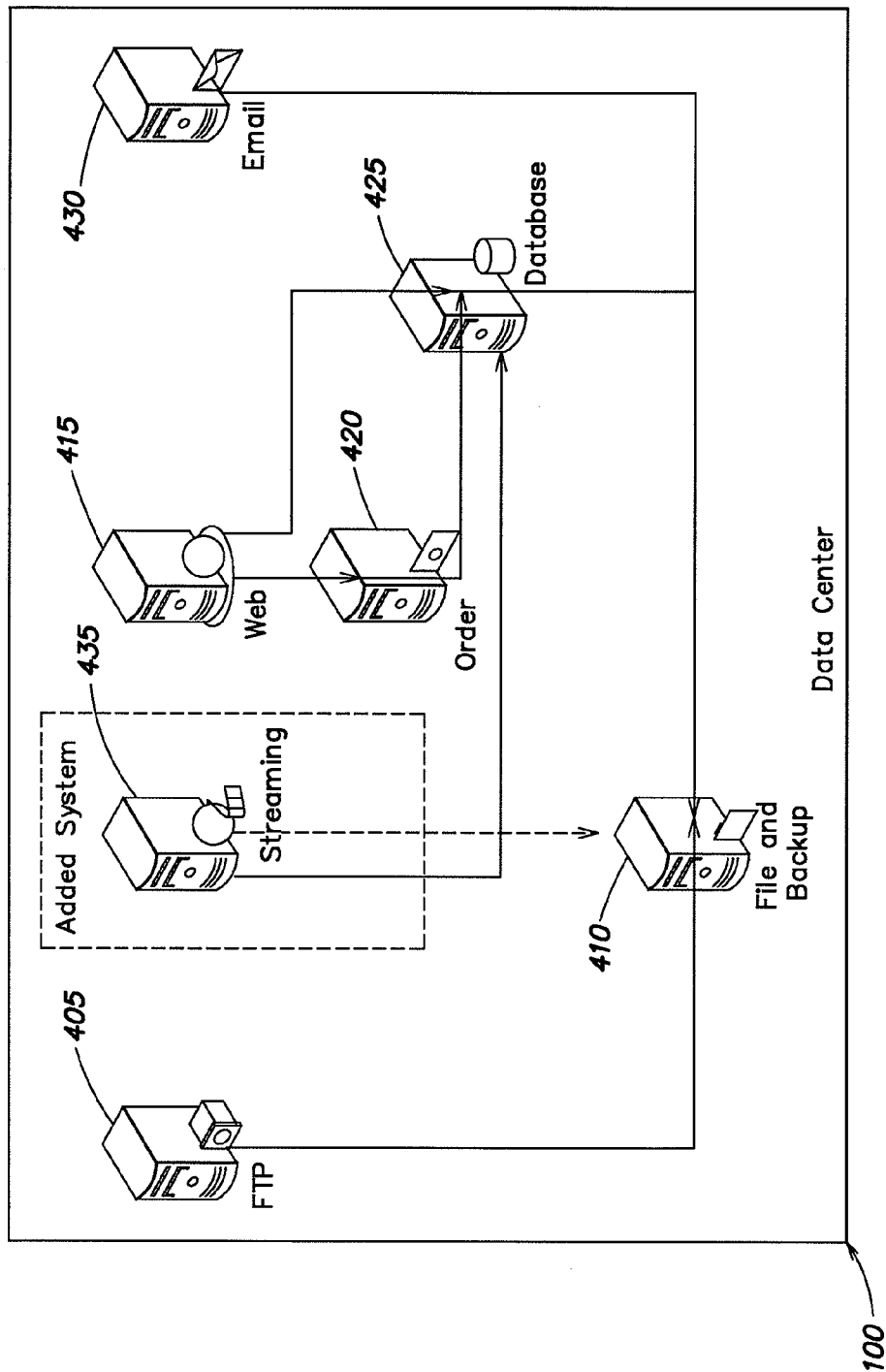
FIG. 4 is a block diagram depicting an example of server configuration in one or more data centers in accordance with an embodiment.

Turning to FIG. 4, there is illustrated an example server configuration in data center 100. Each server depicted in the example of FIG. 4 may include at least one physical, dedicated, or virtual server, and the servers as depicted in FIG. 4 may be physically located in one or more than one data center 100. In one embodiment, data center servers may include an FTP server 405, file and backup server 410, web server 415, order server 420, database server 425, email server 430, and streaming server 435. This server configuration is an example and is not limiting. Other server functions, applications, and configurations are possible. Although depicted in FIG. 4 as being located within one data center 100, the server configuration of FIG. 4 and other server configurations may be located in more than one data center 100.

In one embodiment, different applications to be executed on one or more of servers 405 to 435 illustrated in FIG. 4 can have different reliability parameters. Further, the insertion of a server into a server configuration can require different reliability parameters, and can change existing reliability parameters. As depicted in FIG. 4, FTP server 405 and file and backup server 410 may have a low level of reliability, email server 430 and streaming server 435 may have a medium level of reliability, and web server 415, order server 420, and database server 425 may have a high level of reliability. Other configurations and reliability parameters are possible.

In one embodiment, information technology (IT) or network infrastructure equipment connecting servers in one or more data centers 100 can include connections sufficient to support a requisite level of reliability. For example, FTP server 405 may have a low reliability parameter. Therefore, it may be sufficient for FTP server 405 to be associated with file and backup server 410 that also has, in this example, low reliability demands. In one embodiment, streaming server 435, with, for example, a medium reliability parameter, can be added to the server configuration of FIG. 4. In this example, added streaming server 435 may include a server that can execute a streaming application. However, an inserted streaming server 435 would depend on file and backup server 410, which in this example has a low reliability parameter insufficient to execute the medium reliability streaming application in this example.

With reference to FIGS. 3 and 4, a component of data center controller 210 such as server and network manager 315 can identify network or IT connections between servers. In this example, server and network manager 315 may indicate that file and backup server 410, or a connection between added streaming server 435 and file and backup server 410, would have an insufficient reliability rating to execute a streaming application. Responsive to this determination, server and network manager 315 may instruct that the reliability of file and backup server 410 increase to a level sufficient to allow insertion of streaming server 435 for execution of a streaming application. In one embodiment, dependencies between servers or other elements of data centers 100 or networks 205 can be identified by data center controller 210 or associated components to identify a location to execute an application, and to identify modifications that may be made to data centers 100 to efficiently execute applications at a low cost.

Figure 5:
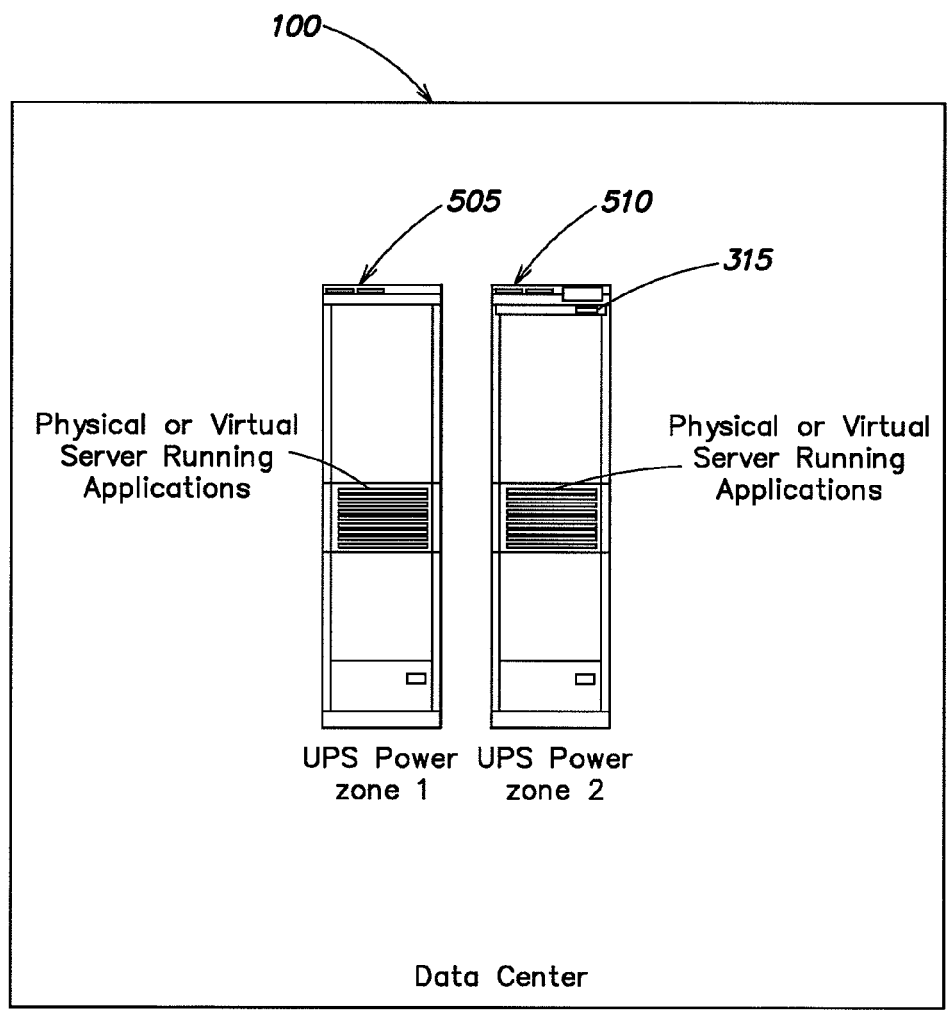
FIG. 5 is a block diagram depicting an example of server configuration in a data center in accordance with an embodiment.

In FIG. 5 there is shown an example of server configuration in data center 100. In one embodiment, FIG. 5 includes first server 505 and second server 510, which, with reference to FIG. 1, may be located in one or more racks 108. First server 505 and second server 510 may each include one or more virtual, physical, or dedicated servers. In one embodiment, first server 505 and second server 510 can be physical infrastructure components that form part of network 205.

As illustrated in FIG. 5, second server 510 including server and network manager 315 implemented as dedicated hardware within second server 510. In one embodiment, server and network manager 315 can be implemented in an application run on a virtual or physical server included within first server 505, second server 510, or both. Data centers 100 may include more than one server and network manager 315 to provide sufficient levels of redundancy and reliability. For example, as illustrated in FIG. 5, first server 505 is located in uninterruptable power supply (UPS) zone 1, and second server 510 is located in UPS zone 2. In one embodiment, both first and second servers 505 and 510 include server manager 315 in the form of a virtual or physical server application. In the event of, for example, a power failure in one of the first and second zones, one of first and second servers 505 and 510, with server manager 315, can remain in operation. Thus, server manager 315 may track and optimize physical locations of servers to identify or request server moves in the event of power outages, service, or maintenance disruptions.

Server and network manager 315 may be provided with parameters, requirements, or operational information of second server 510, as well as those of first server 505 or other servers. In one embodiment, server and network manager 315 may instruct one or more of first and second servers 505 and 510 to execute an application based at least in part on server or data center parameters.

Figure 6:
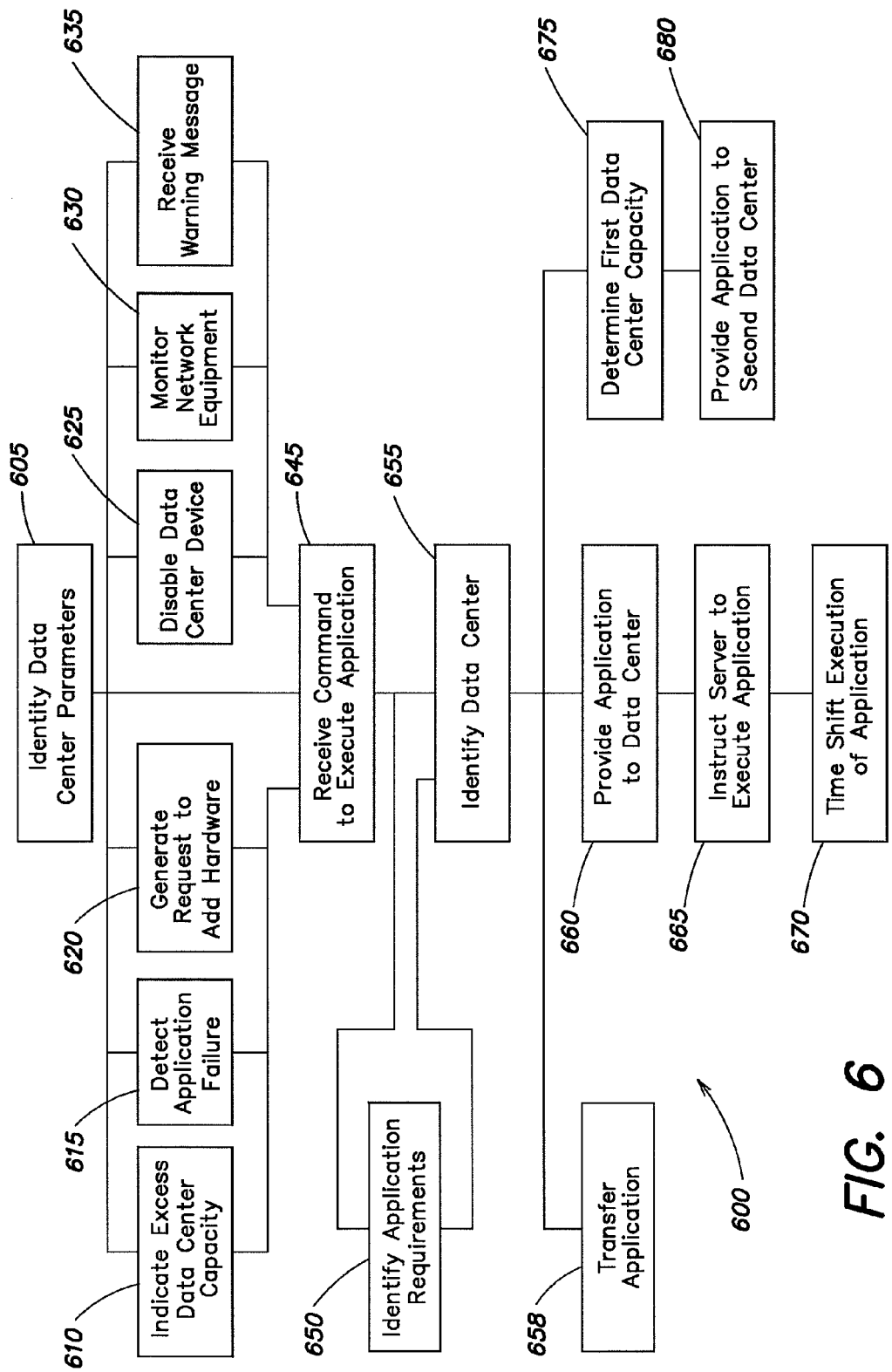
FIG. 6 is a flow chart illustrating an example method of data center control in accordance with an embodiment.

FIG. 6 is a flow chart illustrating an example computer implemented method 600 for data center control. In one embodiment, method 600 includes an act of identifying parameters of data centers (ACT 605) where each data center includes at least one device. For example, identifying data center parameters (ACT 605) may include identifying data center power draw, energy use, cooling capacity, processing capability, operational capacity, tolerances, requirements, or operational ranges. Identifying data center parameters (ACT 605) may include identifying parameters of data centers as a whole as well as identifying parameters of data center components such as servers, racks, or cooling units. Identifying data center parameters (ACT 605) may include identifying parameters of one or more networks associated with a data center. For example, a plurality of data centers may be interconnected by one or more networks and controlled by a controller. Identifying data center parameters (ACT 605) may include identifying parameters of networks, where network parameters may limit data center operation.

In one embodiment, identifying data center parameters (ACT 605) includes identifying parameters or characteristics of select data center devices. Examples of data center devices include cooling subsytems, power subsystems, power generation subsystems, security subsystems, uninterruptable power supplies, servers, processors, and computers. This list is not exhaustive and that data center devices include other components and logic devices, for example. Identifying data center parameters (ACT 605) may include identifying or determining individual status, requirement, dependency, and operation information for data centers, their subsystems, and individual components. In one embodiment, identifying data center parameters (ACT 605) includes identifying power grid parameters of a power grid from which a data center draws power. Other such external parameters may also be identified. For example, identifying data center parameters (ACT 605) may include identifying labor conditions, political or economic turmoil, or other external factors that can effect data center operation. Further examples of data center parameters include any of data center environmental data, temperature inside a data center, temperature outside a data center, power cost, cooling cost, data center facility lease, rent, or ownership cost, service cost, maintenance cost, and labor cost. These lists are examples and are not exhaustive. In various embodiments, the data center parameters may include current or historical data. In one embodiment, identifying data center parameters (ACT 605) may occur in real time or periodic intervals.

Identifying data center parameters (ACT 605) may also include identifying factory provided or built-in device tolerance data. Identifying data center parameters (ACT 605) may include monitoring or sampling data centers or their equipment to determine the parameters. In one embodiment, identifying data center parameters (ACT 605) includes receiving information identifying the parameters. In one embodiment data center parameters that are identified (ACT 605) can be stored for subsequent retrieval in one or more databases or memory storage devices. In one embodiment, identifying data center parameters (ACT 605) includes identifying which data centers or data center components may be available to execute additional applications. For example, a list of available data centers may be provided and ranked in order of available capacity or in order of operating expense. Such a list may be stored in a database and updated in real time or periodically as data center parameters change.

In one embodiment, identifying data center parameters (ACT 605) includes determining the impact that any added components such as subsystems, hardware, or virtual servers have on a data center. For example, identifying data center parameters (ACT 605) may include determining an impact any added data center components have on data center cooling capacity, power draw, or performance.

In one embodiment, method 600 includes an act of indicating excess data center capacity (ACT 610) of one or more data centers. For example, indicating excess data center capacity (ACT 610) may include providing an indication of excess data center capacity to a technician, or to a logic device associated with a different data center that may have less or no excess capacity. In one embodiment, indicating excess data center capacity (ACT 610) includes a graphical display of data center operating capacity or excess capacity in real time. For example, indicating excess data center capacity (ACT 610) may include providing information indicating that a data center is operating at, for example, 80% capacity and thus has 20% excess data capacity. By redistributing data center applications or shutting down data center devices, excess data capacity can be provided to other data centers, reduced, or eliminated.

Method 600 may also include an act of detecting an application failure (ACT 615). In one embodiment, detecting application failure (ACT 615) includes detecting application failure due to a lack of an available data center, data center operational problems, maintenance, network problems, or power supply problems. In one embodiment, an indication of an application failure at a data center may be detected (ACT 615) at a location internal to or remote from the data center where the application failure occurred.

In one embodiment, detecting an application failure (ACT 615) includes locating data center or network equipment associated with or effected by the failure. For example, an application may fail to execute as intended when run on a server. In this example, the server may be identified and identifying information may be provided to a technician, controller, or logic associated with the same or different data centers. In one embodiment, where an application fails to properly execute on a physical server, one or more virtual servers running on top of the virtual server may also be identified. The virtual servers may then be transferred to a different location within the same data center, or to a different data center. In one embodiment, responsive to detecting application failure (ACT 615), a temporary location may be found for application transfer. This temporary location may not be the most suitable location for long term application execution. For example, running the application at the temporary location may increase the burden on a data center component to an unsustainable level. In this example, an application may run at a temporary location until a more suitable location can be identified.

In one embodiment, detecting an application failure (ACT 615) includes providing information related to the failure to technicians. This information may identify failed data center or network equipment, transferred virtual servers, new hardware, maintenance operations, and shut down signals, for example.

Method 600 may include an act of generating a request to add hardware to a data center (ACT 620). In one embodiment, responsive to detecting an application failure (ACT 615), method 600 includes an act of generating a request to add hardware (ACT 620). For example, an application may fail due to a lack of server processing capacity in a data center. Responsive to detection (ACT 615) of this failure, method 600 may generate a request (ACT 620) to add hardware to the data center where the application failed. An attempt may then be made to execute the failed application using new hardware added to the data center responsive to the request (ACT 620). Generating a request to add hardware to a data center (ACT 620) may also include providing the request to a data center technician. In one embodiment, a generated (ACT 620) request may be displayed on a graphical interface. Generating a request (ACT 620) may include generating a request to add a virtual server to a data center.

Method 600 may include an act of disabling one or more data center devices (ACT 625). In one embodiment a data center device such as a server or other component may not be in use, or may be used at a fraction of its capacity. Disabling a data center device (ACT 625) can increase data center efficiency, reduce power draw, and reduce heat generation, all of which can lower the cost of data center operation. Disabling a data center device (ACT 625) may include shutting down a device, removing a device such as a physical or virtual server from a data center, or putting a device in a sleep mode that reduces power draw of that device. In one embodiment, disabling a data center device (ACT 625) includes transferring applications running on that data center device to a different device that may be located in the same or a different data center prior to disabling the device.

In one embodiment, method 600 includes an act of monitoring network equipment parameters (ACT 630). For example, network limitations can limit data center operation. This may include limitations of the network infrastructure equipment that form at least part of the network. Monitoring network equipment (ACT 630) may include any of receiving an indication of network equipment requirements, dependencies, capacity, speed, functionality, or bandwidth. This list of examples is not exhaustive. Monitoring network parameters (ACT 630) may include detecting a network failure or disruption, and may include detecting a power grid disruption of a power grid that may provide power to a data center. In one embodiment, monitoring network equipment (ACT 630) includes monitoring the status of individual network elements, devices, or components such as servers, switches, or routers.

Method 600 may include an act of receiving a warning message (ACT 635). For example, receiving a warning message (ACT 635) may include receiving a message of planned or unplanned data center maintenance, or a power disruption in a location that includes a data center. In one embodiment, receiving a warning message (ACT 635) may include identifying a problem with a data center. For example, receiving a warning message (ACT 635) may include receiving a message that data center components or subsystems are operating at or near capacity.

In one embodiment, receiving a warning message (ACT 635) may include receiving information indicating that a data center, its subsystems (e.g., cooling units) or components (e.g., servers) are being underutilized. For example, a warning message may be received (ACT 635) that a data center or component (e.g., device) thereof is currently using 5% of its available processing capacity. Responsive to this warning message, the data center may be shut down at least temporarily. Any applications running at that data center may be stopped, and a technician may be alerted. Such action may increase overall efficiency and lower cost when a plurality of data centers operate in concert.

In one embodiment, method 600 includes an act of receiving a command to execute an application (ACT 645). Receiving a command to execute an application (ACT 645) may include receiving a request to execute an application. The request or command may be received (ACT 645) from a data center, a network associated with a data center, or a technician, for example. In one embodiment, receiving a command to execute an application (ACT 645) includes receiving a request to transfer an application between data centers or between data center components of one or more data centers. In one embodiment, receiving a request to execute an application (ACT 645) can be responsive to an act of detecting an application failure (ACT 615) at one or more data centers. In one embodiment, receiving a request to execute an application (ACT 645) includes a controller generating the request. In one embodiment, receiving a command to execute an application (ACT 645) includes receiving a command to execute an application at a data center, where the application was provided by a different data center.

In one embodiment, method 600 includes an act of identifying requirements of an application (ACT 650). For example, identifying requirements of an application (ACT 650) may include identifying system resources used by an application during its execution. System resources may include memory or processor capacity used, as well as heat generated, cooling capacity required to control generated heat, or power draw of equipment used to run, store, or execute the application, for example. In one embodiment requirements of an application are identified (ACT 650) responsive to or together with the received (ACT 645) command to execute the application. Identifying requirements of an application (ACT 650) may include identifying a time period in which an application is to be executed. In one embodiment, identifying requirements of an application (ACT 650) includes identifying redundancy, accuracy, reliability, or fault tolerant requirements of an application.

In one embodiment, method 600 includes an act of identifying a data center as a location to run the application (ACT 655). This may include identifying a data center (ACT 655) from a plurality of data centers based at least in part on an evaluation of parameters of the plurality of data centers. These parameters may include, for example power, current, energy, cooling, and device characteristics of data centers as a whole, data center equipment, and network equipment of networks connecting a controller to one or more data centers. Identifying a data center (ACT 655) may include identifying a data center or individual components or subsystems thereof, such as a server. In one embodiment, identifying a data center (ACT 655) includes identifying a data center based at least in part on requirements of an application that may be executed within a data center.

In one example, a plurality of data centers may be connected to each other via at least one network and also connected to at least one controller. These data centers may be geographically disparate. A first data center may be operating, for example, at 35% of its processing capacity but may be using 98% of its cooling capacity and therefore may be drawing a high amount of power. A second data center may be operating, for example, at 90% of its capacity, but may be using only 60% of its cooling capacity and may, in this example, draw less power than the first data center. Continuing with this example, a controller may evaluate the capacity and power draw data of these two data centers and identify (ACT 655) second data center as a location to execute an application. In this example, the application may be a new application, or may be transferred from the first data center to the second data center. Identifying a data center (ACT 655) can include an evaluation of more than data center processing, cooling, and power capacities. For example, network equipment and individual data center subsystems and devices may be evaluated when identifying one or more data centers to execute an application (ACT 655).

The above example is not limiting, and other factors, parameters, and requirements may be considered in identifying a data center (ACT 655). For example, two or more data centers may be drawing equal power, but one of the data centers may be located in a nation or region having less expensive power. In this example, identifying a data center (ACT 655) may include identifying the data center that draws power from a less expensive source, as this decreases the total cost of data center operation. In another example, power generated from an environmentally safer source, (e.g., solar, wind, hydroelectric, or nuclear) may influence an act of identifying a data center (ACT 655). Geographic, and political concerns, as well as labor costs are further examples of factors that may be considered when identifying a data center (ACT 655).

In one embodiment, identifying a data center (ACT 655) may include an evaluation of the climate or local weather conditions in an area that includes a data center. For example, in a cold climate a data center may be designed in a way that minimizes the amount of cooling equipment necessary to cool a data center. In another example, the potential for extreme weather conditions, such as hurricanes or blizzards, could lead to power grid disruptions, and may be considered when identifying a data center (ACT 655).

In one embodiment, identifying a data center (ACT 655) may include identifying a particular data center subsystem or device as a location to execute at least part of an application. For example, identifying a data center (ACT 655) may include identifying a first data center or component thereof to run part of an application, and identifying a different component of the first data center to run another part of an application. Further, another part of the application may be run at a second data center or component thereof. In one embodiment, identifying a data center (ACT 655) includes identifying a time to execute an application at one or more data centers. For example, it may be most cost effective to execute an application at a particular data center in the middle of the night due, for example, to data center use conditions or the resources required to run the application.

In one embodiment, identifying a data center as a location to execute an application (ACT 655) includes identifying the effect that an application would have on a data center, should data center components execute the application. For example, a data center may be operating at 77% of its capacity. Identifying a data center as a location to execute an application (ACT 655) may include a determination that executing an application at the identified data center would cause that data center to operate at a different percentage of its server, rack, cooling, or total capacity. In another example, identifying a data center (ACT 655) may include determining that executing an application on a data center would cause a 0.5% increase in data center power draw if the application is executed during business hours. Other percentages or values indicative of data center or network functionality can be used.

In one embodiment, an indication of the effect an application may have on a data center can be displayed or provided to a technician. In this example, identifying a data center (ACT 655) may occur responsive to an indication from a technician indicating that the effect of an application on a data center is acceptable. In another example, identifying a data center (ACT 655) may occur responsive to an indication from a controller or data center components of any data center indicating that the effect of an application on a data center is acceptable.

In one embodiment, identifying a data center (ACT 655) includes identifying a plurality of data centers having sufficient capacities (e.g., server or cooling) to execute an application. For example, identified data center parameters may be evaluated to produce a list of suitable locations to execute an application within one or more data centers. In this example, the list may be ordered so that at least one location is identified as a primary location. Continuing with this example, a plurality of servers within one or more data centers may be identified from those having the lowest operating expenses to those having the highest operating expenses. Either the data centers themselves or their individual components or subsystems may be identified (ACT 655). In one embodiment, a cluster of virtual servers in one or more data centers can be identified (ACT 655).

Identifying a data center (ACT 655) may include identifying a location of a virtual server of a data center, where the virtual server has sufficient capacities to execute an application. In one embodiment, identifying a data center (ACT 655) includes identifying a virtual server in a data center, and identifying a suitable alternate location for that virtual server. Such alternate location may be within a data center having lower operating expenses or a lower total cost of ownership than another data center. For example, a virtual server capable of executing an application may be in a data center that has an unreliable power grid, or the virtual server may be reliant on other data center components that are insufficient or unreliable. In this example, identifying a data center (ACT 655) may include identifying an alternate location for the virtual server. The alternate location may be in the same or a different data center. A virtual server or cluster of virtual servers may then be transferred to the alternate location to execute an application.

In one embodiment, identifying a data center (ACT 655) includes identifying a data center as being in need of maintenance. In this illustrative embodiment, a technician may approve a request to upgrade or perform maintenance on a data center, its components, or its associated networks or controllers. For example, virtual server performance may increase if hardware of an underlying physical server is upgraded. In this example, identifying a data center (ACT 655) may include, or be responsive to, a request to upgrade server hardware. In one embodiment, the cost of hardware, maintenance, or installation activity when upgrading equipment or adding hardware can be taken into account when identifying a data center (ACT 655). This may occur, for example, in response to a request to add hardware (ACT 620) to a data center.

A specific application need not be provided for execution prior to the act of identifying a data center (ACT 655). For example, identifying a data center (ACT 655) may include identifying a plurality of data centers having, for example, available server processing capacity. A list of these data centers may be ranked by, for example, amount of processing capacity, cost of operation, location, or other factors. This list may be updated periodically or in real time. This list may be retrieved from a memory storage unit or database where it is stored.

In one embodiment, method 600 may include an act of transferring data center applications (ACT 658). Data center applications may be transferred (ACT 658) between devices within a one data server, or from a first data center to a second data center. In one embodiment, transferring data center applications can be responsive to an act of receiving a warning message from a data center (ACT 635). In one embodiment, components such as virtual, physical, or dedicated servers may be added to a data center for the purpose of receiving a transferred (ACT 658) application. Transferring an application (ACT 658) may include transferring an application to two or more physical or virtual locations, or to a cluster of virtual servers. In one embodiment, transferring an application (ACT 658) includes transferring a portion of an application while another portion of an application remains at an existing physical or virtual location.

In one embodiment, transferring a data center application (ACT 658) includes identifying a data center as being capable of executing an application currently allocated or assigned to a device of a different data center. For example, a plurality of data centers may be operating simultaneously. One of the plurality of data centers may be operating in a location where energy costs are lower than energy costs at the location of other data centers. In this example, transferring a data center application (ACT 658) may include identifying a data center having lower energy costs as a location to execute an application currently executed by a different data center that has higher energy costs. In this example, the application may be transferred (ACT 658) from the data center with higher energy costs to the data center with lower energy costs. This reduces overall operating costs of the plurality of data centers. This example of energy costs is not limiting, as other factors, such as labor costs, maintenance, processing capacity, reliability, or power grid durability may be evaluated when transferring a data center to a location to execute an application (ACT 658).

In one embodiment, method 600 includes an act of providing an application to a data center (ACT 660). For example, providing an application to a data center (ACT 660) may include transmitting an application via a network to a data center or component thereof such as a server having sufficient capacity to execute the application. An application may be provided (ACT 660) to a data center via a network, another data center, a technician, or a controller. In one embodiment, providing an application to a data center (ACT 660) includes providing an application to hardware added to a data center responsive to the act of generating a request (ACT 620) to add the hardware. Providing an application to a data center (ACT 660) may change data center operating characteristics and other parameters.

In one embodiment, method 600 includes an act of instructing a server or other data center component to execute an application (ACT 665). For example, an application may be provided to a data center (ACT 660) for immediate execution by a server or other data center component. Instructing a server to execute an application (ACT 665) may also include instructions as to how an application is to be executed. For example, instructions may include reliability or fault tolerance specifications. In various embodiments, instructing a data center to execute an application (ACT 665) can be responsive to, for example, transferring an application (ACT 658), providing an application to a data center (ACT 660), providing an application to a second data center (ACT 680) or identifying a data center (ACT 655).

In one embodiment, method 600 includes an act of time shifting execution of an application (ACT 670). Time shifting execution of an application (ACT 670) may include delaying execution of an application. For example, when identifying requirements of an application (ACT 650), it may be determined that execution of an application is not time sensitive. Further, a data center may have additional capacity on certain days such as holidays or weekends, or at certain times of day, such as after a stock market is closed or after working hours. In situations such as these, an application may be time shifted (ACT 670) to use a data center during a period of reduced data center activity. In one embodiment, instructions to execute an application (ACT 665) include instructions to time shift execution of the application (ACT 670). In one embodiment, time shifting execution of an application (ACT 670) can be responsive to identification of data center parameters (ACT 605). Further, time shifting execution of an application (ACT 670) may be responsive to receipt of a warning message (ACT 635). The warning message may indicate, for example, that a data center or components thereof are at or near capacity, that data center maintenance is scheduled, that a power grid associated with a data center is disrupted, that there are labor or security concerns, or other factors.

Method 600 may include an act of determining a first data center capacity (ACT 675). For example, determining first data center capacity (ACT 675) may include determining an amount of data center capacity being used, or an amount of data center capacity that is available. The data center capacity that is determined (ACT 675) may include processing capacity, power capacity, or cooling capacity of a data center as a whole or of individual subsystems or elements therein. For example, identifying first data center capacity (ACT 675) may include identifying a server in a data center as having sufficient capacity to execute an application. First data center capacity may be determined (ACT 675) based on information provided by the first data center or its equipment, or by extrapolation based on known equipment tolerances and information related to a number of applications first data center may be executing.

Determining a first data center capacity (ACT 675) may include identifying a data center as having excess or available capacity. Determining a first data center capacity (ACT 675) may also include determining that a data center is operating at capacity. For example, a data center may be drawing 100% of its available power, or data center cooling units may be operating at capacity. Further, servers or other components may be operating at their maximum processing capacity, or memory devices may be full. In one embodiment, identifying data center parameters (ACT 605) includes an act of determining a first data center capacity (ACT 675).

In one embodiment, determining a first data center capacity (ACT 675) may be accomplished by referencing a data center model. For example, a data center controller external to a data center may simulate data center operation. In this example, determining a first data center capacity (ACT 675) may include determining data center capacity based on simulated—as opposed to measured—data center data.

In one embodiment, method 600 includes an act of providing an application to a second data center (ACT 680). Providing an application to a second data center (ACT 680) may occur responsive to at least one of determining first data center capacity (ACT 675), receiving a warning message (ACT 635), detecting an application failure (ACT 615), monitoring network equipment parameters (ACT 630), indicating excess data center capacity (ACT 610), and identifying data center parameters (ACT 605), for example. In one embodiment, providing an application to a second data center (ACT 680) includes providing an application to second data center components such as a server for execution. In one embodiment, providing an application to a second data center (ACT 680) includes providing a portion of the application to a second data center.

The energy consumption of a data center, such as data center 100 of FIG. 1 can be reduced by consolidating workload into fewer racks 108, or servers included therein. For example, a server can consume approximately half of its maximum power in an idle state, and powering down unused servers and other equipment reduces overall energy consumption. Distributing workload, (e.g., applications) among a plurality of racks 108 and servers can also reduce server and rack 108 power consumption. In one embodiment, data center controller 210 distributes workload among servers based on a server utilization threshold that minimizes individual server power consumption. For example, data center controller 210 can distribute workload to a plurality of servers so that they operate at approximately 68% of their total computing power. Other percentages are possible between 0-100%. This consolidates workload across some servers of one or more data centers 100, allowing for other servers to be powered down. While this example minimizes server (or rack 108) power consumption, the workload distribution in this example is based primarily on server or rack power utilization and does not necessarily minimize consumption by cooling unit 104 or overall data center 100 power consumption.

When workload distribution does not take cooling power consumption into account, cooling units 104 may have to consume additional power to compensate for the workload distribution among a plurality of servers, or additional cooling units 104 may be needed. This can offset server power savings and prevent data center 100 from operating at its minimum total power consumption. In one embodiment, total power consumption of a data center is minimized by controlling the power consumption of both cooling units and racks. For example, data center controller 210 can determine the usage, operational state, and combination of racks 108 (including servers) and cooling units 104 that minimize total data center 100 power consumption. Data center energy consumption can also be reduced by consolidating cooling unit load into fewer cooling units 104. Racks 108 and cooling units 104 can be fully or partially utilized, or powered off.

Data center 100, or their components such as racks 108 and cooling units 104, can be divided into a plurality of zones or clusters. For example, a cluster of racks 108 can include a plurality of racks 108 clustered in an area of data center 100. This may correspond to complete rows 102, a portion of row 102, or portions of multiple rows 102. A cluster of cooling units 104 can include a grouping of equipment that is room based or included in at least one row 102 of data center 100. A cluster can also include a group of at least one rack 108 and at least one cooling unit 104.

In one embodiment, data center controller 210 determines an actual or simulated utilization rate $u_i^R$ of at least one rack 108. These determinations can occur in real time. Rack utilization rate $u_i^R$ represents the fraction of maximum computing load assigned to each rack. Rack utilization rate $u_i^R$ can be represented, for example, as a percentage from 0-100%, in millions of instructions per second (MIPS), or as a number between zero and one. Data center controller 210 can also determine an actual or simulated utilization rate $u_i^C$ of at least one cooling unit 104, which represents the fraction of maximum airflow delivered by a cooler. Cooling utilization rate $u_i^C$ can be represented, for example, as a percentage between 0% and 100%, or as a number greater than a minimum threshold value and less than or equal to one. In one embodiment, the minimum threshold value is greater than zero.

Rack power consumption $P_i^R$ is represented by equation (1), where $P_0^R$ represents minimal rack power in a standby or idle state, $P_{max}^R$ represents maximum rack power, and $u_i^R$ represents the rack utilization rate.

$$P_i^R = P_0^R + (P_{max}^R - P_0^R) \cdot (u_i^R) \quad (1)$$

Cooling unit power consumption $P_i^C$ is represented by equation (2), where $P_0^C$ represents minimal cooling unit power in a standby or idle state, (e.g., 50 W for an in row cooling unit 104 with a ½ rack footprint,) $P_{max}^C$ represents maximum cooling unit power, and $u_i^C$ represents the cooling unit utilization rate.

$$P_i^C = P_0^C + (P_{max}^C - P_0^C) \cdot (u_i^C)^3 \quad (2)$$

Data center controller 210 can distribute workload to minimize the total power consumption of racks 108 and cooling units 104, where the total power consumption $P_{TOTAL}$ is represented by equation (3).

$$P_{TOTAL} = \sum_i^n P_i^R + \sum_i^N P_i^C \quad (3)$$

In one embodiment, data center controller 210 determines $P_{TOTAL}$ based on simulated rack 108 and cooling unit 104 power consumption data. $P_{TOTAL}$ can include the total power consumption of at least one data center 100, or clusters of racks 108 and cooling units 104 included therein, where n is the number of racks and N is the number of cooling units. Racks 108 can include at least one server, and cooling unit 104 can be room based, or located in row 102, and can have a full rack or half rack footprint. In one embodiment, the workload distribution that minimizes total power consumption $P_{TOTAL}$ does not exceed the total required computing power of a cluster, which is the summation of the product of maximum computing capacity $c_i^{max}$ and rack utilization rate $u_i^R$ for the number n of racks 108 in the cluster, represented by equation (4).

$$TotalRequiredComputingPower = \sum_i^n c_i^{max} \cdot u_i^R \quad (4)$$

Data center controller 210 can determine workload distribution that minimizes $P_{TOTAL}$ while satisfying at least one rack based cooling metric based, for example, on airflow patterns associated with the supply of cool air to, or the removal of hot air from at least one rack 108. For example, data center controller 210 can perform a cooling analysis on a cluster of equipment in data center 100 to identify a rack 108 for distribution of an application that uses additional power. Additional cooling air flow (e.g., in cfm) that cools the affected rack 108 can be based on average flow requirements for the existing equipment in that rack 108, (e.g., 160 cfm/kW). In one embodiment, data center controller 210 determines a capture index (CI) of each rack as described in U.S. patent application Ser. No. 12/019,109, titled "System and Method for Evaluating Equipment Rack Cooling," filed Jan. 24, 2008 and U.S. patent application Ser. No. 11/342,300, titled "Methods and Systems for Managing Facility Power and Cooling," filed Jan. 27, 2006, both of which are incorporated herein by reference in their entirety.

Data center controller 210 can determine the cold aisle 112 and hot aisle 110 capture index associated with at least one rack 108 that can be located in data center 100 between hot aisle 110 and cold aisle 112. In one embodiment, the capture index of cold aisle 112 is the fraction of air ingested by rack 108 that originates from local cooling resources such as perforated floor tiles 114 or cooling unit 104. The capture index of hot aisle 110 can be the fraction of air exhausted by rack 108 that is captured by local extracts such as return vents or cooling unit 104. The capture index may vary from 0-100% with better cooling performance generally indicated by greater capture index values. For example, with reference to rack 108 and cold aisle 112, a high capture index (e.g., greater than or equal to approximately 90%) indicates that the bulk of the air ingested by rack 108 originates from cooling resources rather than being drawn from the general data center 100 room environment or from air that may have already been heated from data center 100 equipment. In this example, the inlet temperature of rack 108 can generally track the airflow of perforated floor tiles 114 to achieve acceptable cooling when the airflow of perforated floor tiles 114 are within a desired temperature range. With reference to rack 108 and hot aisle 110, a high capture index indicates that exhaust from rack 108 is captured locally with minimum heating of its surrounding environment in data center 100.

In one embodiment, a high capture index indicates good cooling performance. However, a low capture index does not necessarily indicate an unacceptable cooling performance. For example, in a rack based raised floor environment that draws most of its air airflow from the surrounding room environment rather than from perforated tiles 114, the cold-aisle capture index of rack 108 may be low; however, if the surrounding data center 100 environment is sufficiently cool, the inlet temperature of rack 108 may still be acceptable. In this example, the cooling requirements of rack 108 can be satisfied by the external environment of data center 100 rather than by airflow from perforated floor tiles 114 within a cluster that includes rack 108. If this process is repeated many times throughout data center 100, facility cooling will be complex and may be unpredictable. High capture values lead to inherently scalable cluster layouts of data center 100 and more predictable room environments. In one embodiment, the cooling performance of a cluster is satisfactory when the capture index for all racks 108 in the cluster is greater than 90%. This threshold may increase as cooler supply and surrounding ambient temperatures approach the maximum target inlet temperature of at least one rack 108. Workload distribution, cooling unit 104 distribution, and data center layout can also be based on other rack based or other cooling metrics involving computational fluid dynamics.

Figure 7:
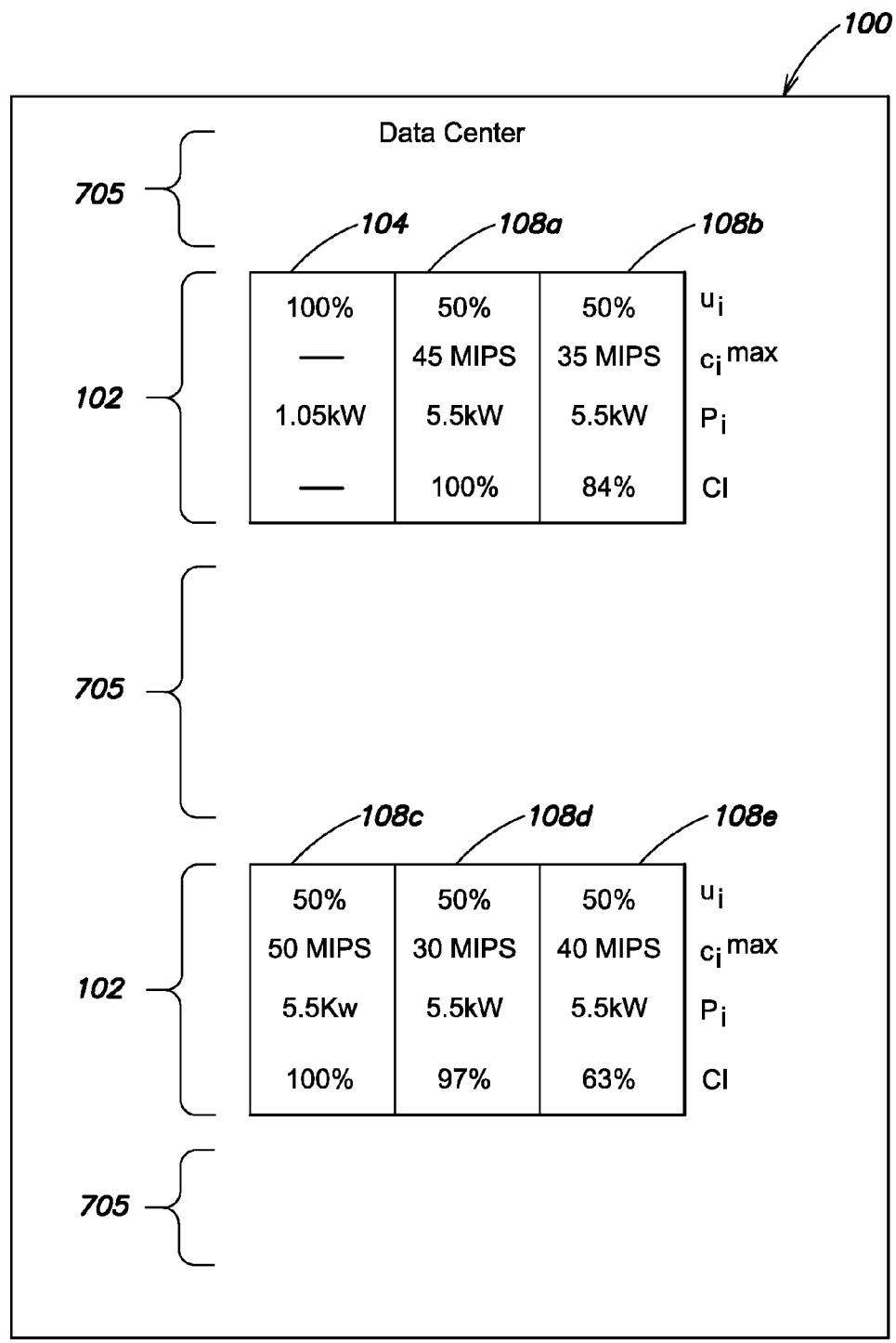
FIG. 7 depicts a workload distribution layout of a data center 100 in accordance with an embodiment.
Figure 8:
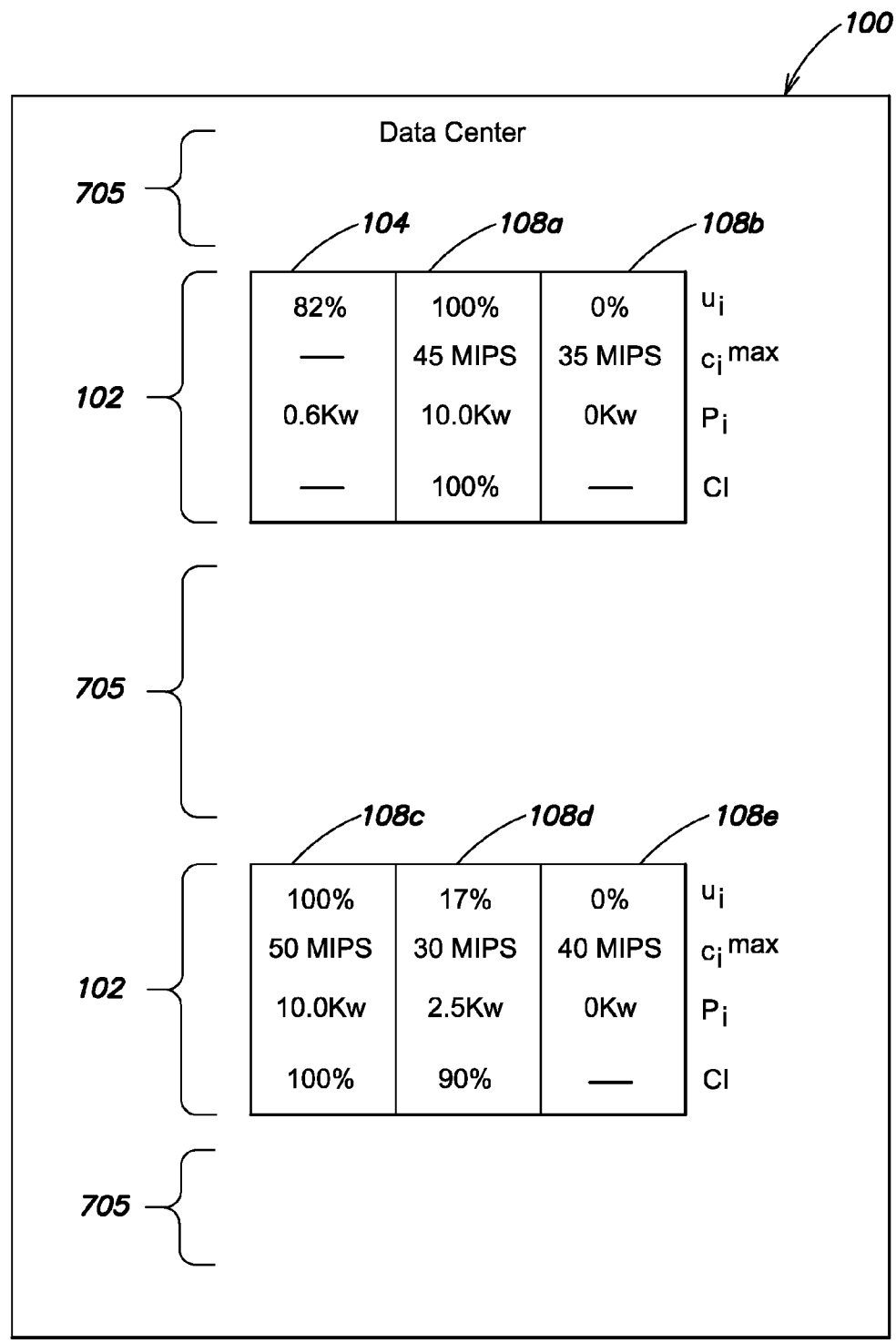
FIG. 8 depicts a workload distribution layout of a data center 100 in accordance with an embodiment.

One embodiment where workload (e.g., applications) is distributed to data center equipment is depicted in FIG. 7 and FIG. 8. FIG. 7 depicts an initial layout workload distribution of data center 100, and FIG. 8 depicts a layout of data center 100 with a distributed workload to minimize total power consumption $P_{TOTAL}$. In one embodiment, data center controller 210 cycles through a plurality of layouts to arrive at the optimal layout with minimal total power consumption of, for example, FIG. 8 from an initial or prior layout such as that of FIG. 7.

FIG. 7 illustrates a cluster of data center 100 that includes one cooling unit 104 and a plurality of racks 108(a) through 108(e) located in two rows 102. Rows 102 are separated by aisles 705, which with reference to FIG. 1 can be hot aisles 110 or cold aisles 112. Clusters of equipment in data center 100 can include more or less equipment than depicted in FIG. 7, and clusters can include equipment from more or fewer than the two rows 102, and cooling unit 104 need not be at an end of row 102 as depicted in FIG. 7.

In the initial layout of FIG. 7, the utilization rate $u_i$, maximum computing capacity $c_i^{max}$, power consumption $P_i$, and capture index (CI) are indicated for each rack 108($a$-$e$), and the utilization rate $u_i$ and power consumption $P_i$ are indicated for cooling unit 104. The initial data center layout can be a proposed layout of data center 100 in a planning stage prior to its construction or assembly, and can be based on parameters such as clustering racks 108 nearest to cooling units 104, or rack 108 computing capacity $c_i^{max}$. The layout of FIG. 7 can also represent a model of an operating data center.

In the example of FIG. 7, an initial data center design parameter gets each rack 108($a$-$e$) to operate at a 50% utilization rate. As illustrated, cooling unit 104 has a utilization rate $u_i^C$ of 100%, and is operating at maximum capacity with a power consumption $P_i^C$ of 1.05 kW. Each of racks 108($a$-$e$) is operating at a rack utilization rate $u_i^R$ of 50%, with a power consumption of 5.5 kW. The total power consumption in this example is the sum of cooling unit 104 and rack 108($a$-$e$) power consumption, which is 28.55 kW.

In one embodiment, data center controller 210 determines a different workload distribution from the initial layout of FIG. 7 that satisfies cooling goals by maintaining, for example, a capture index of at least 90% for each rack 108 that is being utilized, e.g., not powered down. FIG. 8 depicts a cluster of data center 100 with workload distributed to minimize total power consumption $P_{TOTAL}$ of equation (3) above. Instead of distributing workload across racks 108($a$-$e$) to satisfy a user defined threshold of each rack 108 operating at 50% (or any other percent) utilization rate, as in the example of FIG. 7, data center controller 210 can provide an optimal workload as illustrated in FIG. 8. The optimal workload distribution is determined by minimizing total power consumption $P_{TOTAL}$ while satisfying cooling performance standards such as a high capture index or other cooling metrics.

With reference to FIGS. 7 and 8, some workload shifts between racks 108($a$-$e$) to minimize total power consumption $P_{TOTAL}$. In this example, racks 108$a$ and 108$c$ have a utilization rate $u_i^R$ of 100% and power capacity $P_i^R$ of 10.0 kW each, which is double with respect to FIG. 7, while maintaining a capture index of 100%. Concentrating workload in racks 108$a$ and 108$c$ in this example removes all workload from racks 108$b$ and 108$e$ so that these racks may be shut down and have a utilization rate $u_i^R$ of 0% and power consumption $P_i^R$ of 0.0 kW. This example also reduces the utilization rate $u_i^R$ and power consumption $P_i^R$ of rack 108$d$ to 17% and 2.5 kW. Further, this configuration reduces cooling unit utilization rate $u_i^C$ to 82% and power consumption $P_i^C$ to 0.6 kW. While the workload distribution of FIG. 7 has a total power consumption of 28.55 kW, the total power consumption of the same workload by the same cluster when optimized as depicted in FIG. 8 is the sum of cooling unit 104 and rack 108($a$-$e$) power consumption, which is 23.10 kW, which is a 19.1% power savings relative to the workload distribution of FIG. 7.

In one embodiment, data center controller 210 determines a physical layout of servers, racks 108 and cooling units 104 at a planning or design stage for the creation of data center 100. For example, data center controller 210 can determine a preliminary data center 100 layout based on a rack based parameter, such as the 50% utilization rate $U_i^R$ of FIG. 7, and can modify the preliminary layout to identify an optimized layout that minimizes total power consumption of data center 100 or one or more clusters of equipment included therein while maintaining rack and cooling utilization rates $u_i$, and total rack 108 computing power at or below 100%, and while maintaining the capture index CI within a tolerance range or above a threshold level. In one embodiment, data center controller 210 models a plurality of data center layouts and performs a number of iterations before arriving at the optimal layout from a total power consumption standpoint using, for example, a method of steepest descents. The calculations and determinations made by data center controller 210 and other logic devices of data center 100 can be made in real time.

Figure 9:
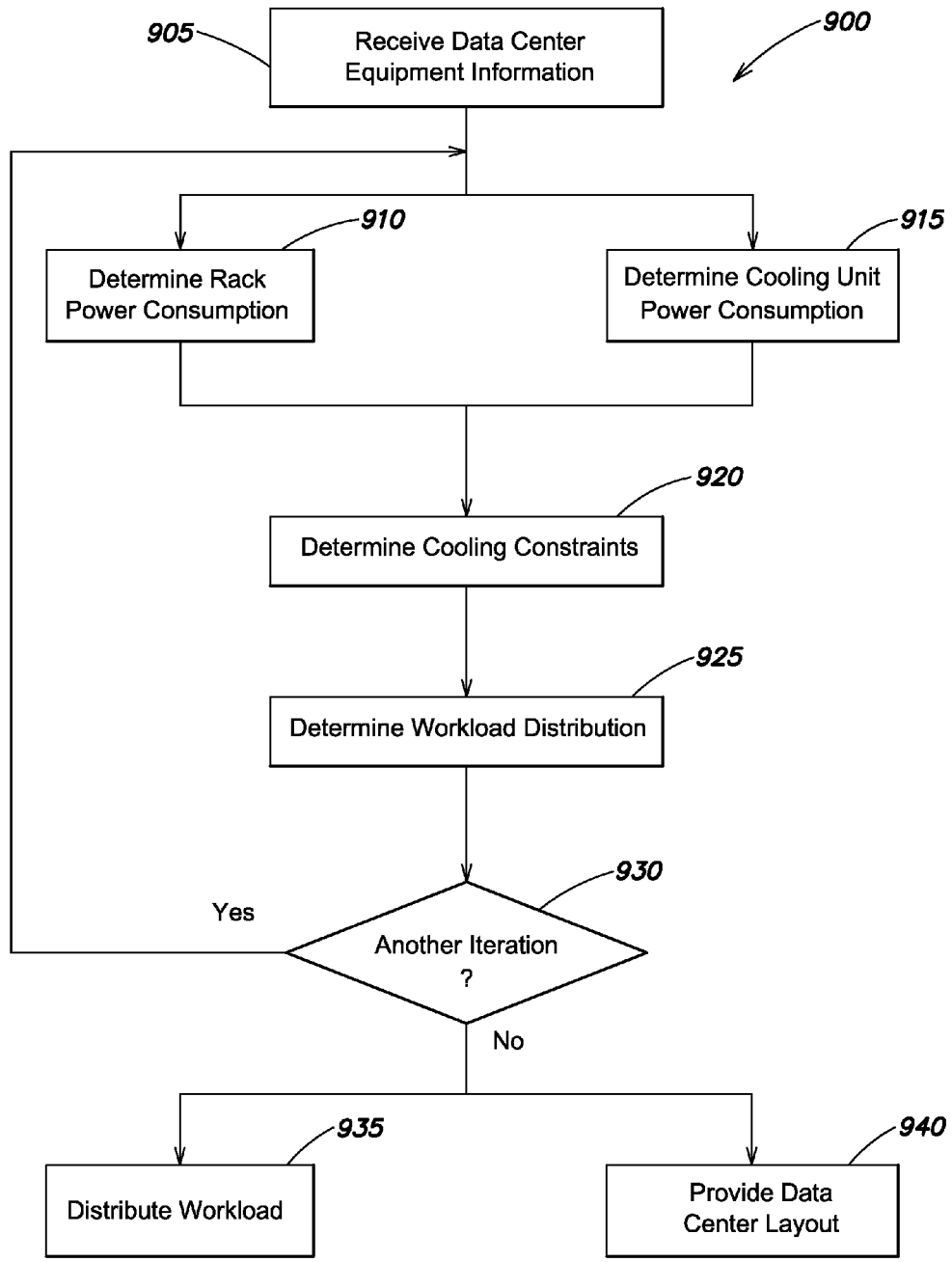
FIG. 9 depicts a flow chart illustrating an example method of data center control in accordance with an embodiment.

FIG. 9 is a flow chart illustrating an example computer implemented method 900 for data center control. The acts of method 900 can occur in real time. In one embodiment, method 900 includes an act of receiving data center equipment information (ACT 905) of at least one data center. For example, receiving information (ACT 905) includes receiving information about cooling unit, server, or rack operation in a data center. A data center controller can receive (ACT 905) utilization rate $u_i$ and determine power consumption $P_i$ information of racks and cooling units. The received (ACT 905) information can also include rack computing capacity information such as a maximum computing capacity of servers included therein, and a rack cooling metric, such as a capture index value. Data center information can be received (ACT 905) from individual data center components, or from clusters of components that may include at least one cooling unit and at least one rack.

In one embodiment, the receiving act (ACT 905) includes receiving operational, load, planned, or tolerance information about data center cooling units, racks, servers, or other data center equipment. Receiving information (ACT 905) includes receiving simulated information or actual information, for example measured in substantially real time. Receiving information (ACT 905) may also include receiving tolerance information such as maximum or minimum capacities of data center equipment. The information can be received (ACT 905) electronically or via a user interface.

Method 900 includes an act of determining rack power consumption (ACT 910) of at least one rack. Determining rack power consumption (ACT 910) may include determining the power consumption of rack components, such as servers. Power consumption $P_i^R$ of at least one rack can be determined (ACT 910) as the standby rack power consumption $P_0^R$ plus the product of the rack utilization rate $u_i^R$ and the difference between maximum $P_{max}^R$ standby $P_0^R$ rack power, as indicated in equation (1) above. In one embodiment, method 900 includes an act of determining cooling unit power consumption (ACT 915) of at least one cooling unit. Power consumption of at least one cooling unit can be determined (ACT 915) as the standby cooling power consumption $P_0^C$ plus the product of the cube of the cooling utilization rate $(u_i^C)^3$ and the difference between maximum $P_{max}^C$ standby $P_0^C$ cooling unit power, as indicated in equation (2) above. In one embodiment, the total power consumption of a cluster of at least one rack and at least one cooling unit is determined by summing the determined rack power consumption (ACT 910) and the determined cooling unit power consumption (ACT 915). The cluster may include all or part of the equipment of a data center.

Method 900 may include an act of determining cooling constraints (ACT 920), such as a rack based cooling metric. In one embodiment, a capture index is determined (ACT 920) that indicates a percentage of air ingested by a rack that originates from a cooling unit or other local resource, or a percentage of air exhausted by a rack that is captured by a cooling unit or other local extract.

In one embodiment, method 900 includes an act of determining data center workload distribution (ACT 925). Determining workload distribution (ACT 925) may include determining a workload distribution layout of racks and cooling units with minimal total power consumption. For example, a data center controller can identify a workload distribution of a cluster of at least one rack and at least one cooling unit that minimizes total power consumption of that cluster. In this example, applications can be distributed (ACT 925) to at least one rack or cooling unit, with at least one other rack or cooling unit operating with a reduced load or shut down. Workload can be distributed (ACT 925) between racks while satisfying a rack based cooling metric, or while maintaining cooling and other data center criteria. For example, workload can be distributed between racks of one or more rows, or cooling load can be distributed between cooling units, while maintaining rack computing capacity $c_i$ at or below its maximum level $c_i^{max}$, so that rack and cooling unit utilization rates remain at or below 100%. In one embodiment, workload distribution among racks is determined while maintaining the hot aisle or cold aisle capture index of at least one rack at a high level, e.g., above 90%.

Determining workload distribution (ACT 925) may include identifying at least one server included in a rack for distribution of an application, and may include identifying workload for transfer between servers of the same rack or of different racks. In one embodiment, determining workload distribution (ACT 925) includes an instruction to physically locate or relocate a rack within a data center. Determining workload distribution (ACT 925) may include identifying at least one cooling unit for load adjustment, and may include identifying cooling unit load for transfer between cooling units. In one embodiment, determining workload distribution (ACT 925) includes an instruction to physically locate or relocate a cooling unit within a data center.

After a first iteration of acts 900-925, a determined layout of data center components can process distributed workload while maintaining rack based cooling metrics that satisfy a threshold. In one embodiment, method 900 includes at least one further iteration of acts 900-925 to determine another data center layout that further minimizes total power consumption. Determining to proceed with another iteration (ACT 930) can include receiving information about the determined workload distribution and data center layout, including data center equipment and cooling unit load information. Rack and cooling unit power consumption can again be determined, and a second workload distribution can be determined. The iterations can repeat a plurality of times, until one data center layout is identified with minimal power consumption when compared to the other identified layouts, while maintaining cooling constraints such as rack based cooling metrics. For example, a data center layout can be determined based on the rack utilization rate, cooling utilization rate, computing requirements, or power consumption of a rack, cooling unit, or server. One or more of these characteristics can be modified, with a new layout determined based in part on the modified characteristics. This process may iterate (ACT 930), with one or more characteristics modified, until an optimal workload distribution and data center layout is determined. When no further iterations are desired, method 900 may proceed, for example by distributing workload to data center equipment (ACT 935) or by providing data center layout information (ACT 940).

In one embodiment, distributing workload (ACT 935) includes providing an application to a data center, or providing instructions for a server or other data center component to execute an application. Distributing workload (ACT 935) may also include transferring workload between components (e.g, racks, servers) or cooling load between cooling units of one or more data centers.

Providing a data center layout (ACT 940) can include determining a physical layout of data center components in a data center during a data center planning stage. For example, data center characteristics, such as row, rack, or cooling unit placement within a data center can be varied and sequentially analyzed, and workload distribution can be determined for each layout. Providing a data center layout (ACT 940) can include designing an initial layout of a data center or changing a layout of an existing data center. Providing a data center layout (ACT 940) can also include distributing or redistributing cooling load among one or more cooling units. This may include providing or removing cooling units to or from data centers, identifying their initial capacity and power requirements, or adjusting capacity and power requirements based, for example, on a cooling metric. Total power consumption, including rack, cooling unit, or cluster power consumption can be determined for different layouts, with the workload distribution to racks or cooling units determined based, for example, on the layout having minimum total power consumption. The data center layout can also be provided (ACT 940) usage forecasts or to meet planned energy utilization, availability, and rack, server, or cooling unit consumption criteria. In one embodiment, providing a data center layout (ACT 940) includes providing a simulated layout.

The acts of method 900 are compatible with and complementary to method 600. For example, the acts of data center control described in method 600 are applicable to and may be combined with the acts of data center control described in method 900. Various individual acts of method 600 and method 900 can be combined as part of the same embodiment. Further, methods 600 and 900 may be performed on a common data center controller.

Various aspects and embodiments described herein may be implemented on one or more computer systems as discussed above. For example, system 200 may be implemented in a single computer system or in multiple computer systems. These computer systems may be, for example, general-purpose computers such as those based on Intel PENTIUM-type processor, Motorola PowerPC, Sun UltraSPARC, Hewlett-Packard PA-RISC processors, or any other type of processor.

Figure 10:
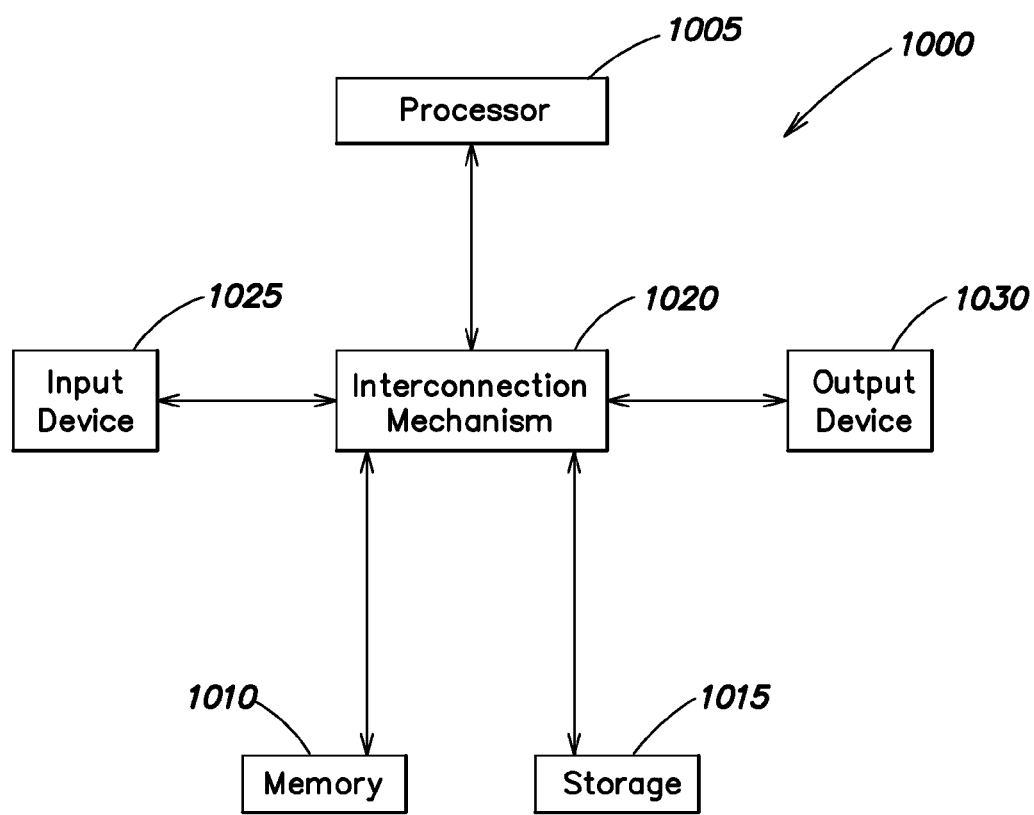
FIG. 10 is a functional block diagram of a computer system in accordance with an embodiment.

For example, various aspects may be implemented as specialized software executing in a general-purpose computer system 1000 such as that shown in FIG. 10. The computer system 1000 may include a processor 1005 connected to one or more memory devices 1010, such as a disk drive, memory, or other device for storing data. Memory 1010 is typically used for storing programs and data during operation of the computer system 1000. The computer system 1000 may also include a storage system 1015 that provides additional storage capacity. Components of computer system 1000 may be coupled by an interconnection mechanism 1020, which may include one or more busses (e.g., between components that are integrated within a same machine) and/or a network (e.g., between components that reside on separate discrete machines). The interconnection mechanism 1020 enables communications (e.g., data, instructions) to be exchanged between system components of system 1000.

Computer system 1000 also includes one or more input devices 1025, for example, a keyboard, mouse, trackball, microphone, touch screen, and one or more output devices 1030, for example, a printing device, display screen, speaker. In addition, computer system 1000 may contain one or more interfaces (not shown) that connect computer system 1000 to a communication network (in addition or as an alternative to the interconnection mechanism 1020).

Figure 11:
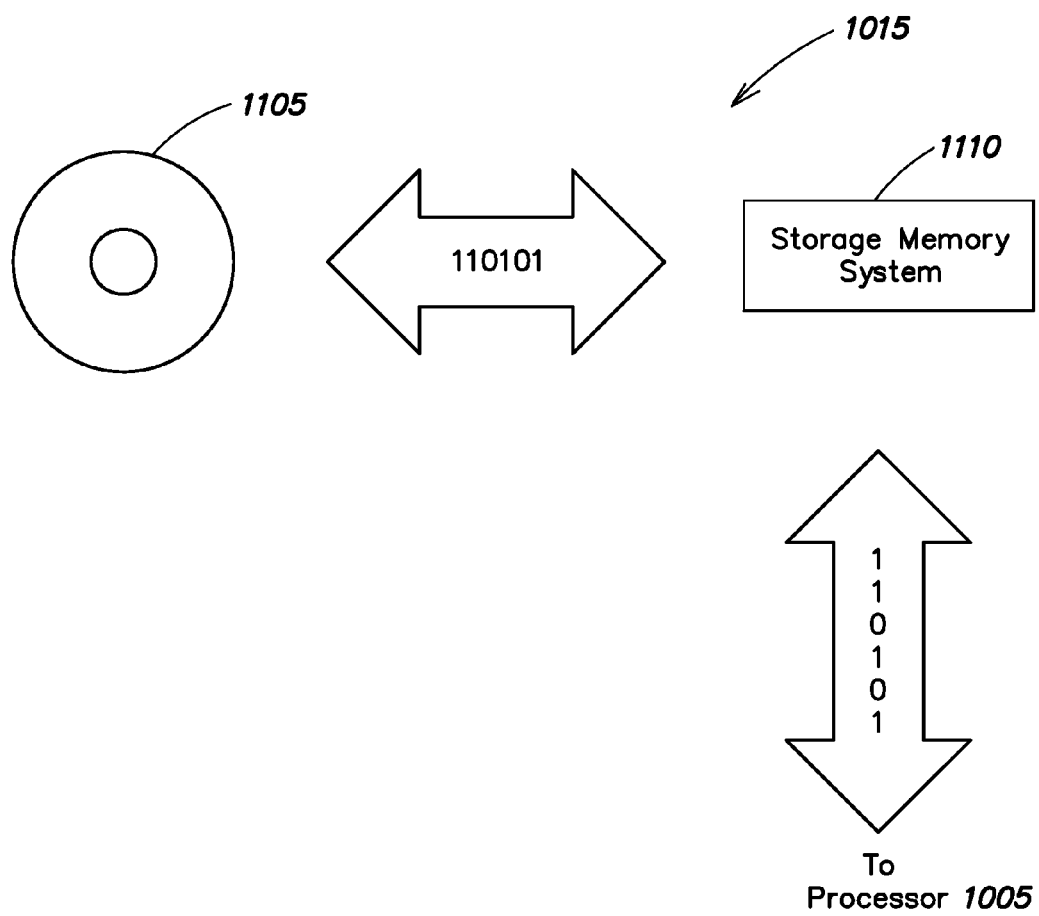
FIG. 11 is a functional block diagram of a storage system in accordance with an embodiment.

The storage system 1015, shown in greater detail in FIG. 11, typically includes a computer readable and writeable nonvolatile recording medium 805 in which signals are stored that define a program to be executed by the processor or information stored on or in the medium 1105 to be processed by the program to perform one or more functions associated with embodiments described herein. The medium may, for example, be a disk or flash memory. Typically, in operation, the processor causes data to be read from the nonvolatile recording medium 1105 into another memory 1110 that allows for faster access to the information by the processor than does the medium 1105. This memory 1110 is typically a volatile, random access memory such as a dynamic random access memory (DRAM) or static memory (SRAM). It may be located in storage system 1015, as shown, or in memory system 1010. The processor 1005 generally manipulates the data within the integrated circuit memory 1010, 1110 and then copies the data to the medium 1105 after processing is completed. A variety of mechanisms may manage data movement between the medium 1105 and the integrated circuit memory element 1010, 1110, and the examples provided herein, including example memory system 1010 and storage system 1015 are not limiting.

Computer systems implemented herein may include specially-programmed, special-purpose hardware, for example, an application-specific integrated circuit (ASIC). Various aspects described herein may be implemented in software, hardware or firmware, or any combination thereof. Further, such methods, acts, systems, system elements and components thereof may be implemented as part of the computer system described above or as an independent component.

Although computer system 1000 is shown by way of example as one type of computer system upon which various aspects described herein may be practiced, aspects and embodiments are not limited to being implemented on the computer system as shown in FIG. 10. Various aspects may be practiced on one or more computers having a different architecture or components shown in FIG. 10. Further, where functions or processes of embodiments that are described herein (or in the claims) as being performed on a processor or controller, such description includes systems that use more than one processor or controller to perform the functions.

Computer system 1000 may be a general-purpose computer system that is programmable using a high-level computer programming language. Computer system 1000 may be also implemented using specially programmed, special purpose hardware. In computer system 1000, processor 1005 may be a commercially available processor such as the well-known Pentium class processor available from the Intel Corporation. Other processors are available, such as those that can execute an operating system which may be, for example, the Windows 95, Windows 98, Windows NT, Windows 2000 (Windows ME), Windows XP, Windows Vista, or Windows 7 operating systems available from the Microsoft Corporation, MAC OS System X operating system available from Apple Computer, the Solaris operating system available from Sun Microsystems, or UNIX operating systems available from various sources. Many other operating systems may be used.

The processor and operating system together define a computer platform for which application programs in high-level programming languages are written. Embodiments of the systems and methods described herein are not limited to a particular computer system platform, processor, operating system, or network. These systems and methods are not limited to a specific programming language or computer system. Other programming languages and other appropriate computer systems can be used.

One or more portions of the computer system may be distributed across one or more computer systems coupled to a communications network. For example, as discussed above, network manager 315 may be located remotely from change and capacity manager 305. These computer systems also may be general-purpose computer systems. For example, system 200 elements can be distributed among one or more computer systems configured to provide a service (e.g., servers) to one or more client computers, or to perform an overall task as part of a distributed system. For example, operations may be performed on a client-server or multi-tier system that includes components distributed among one or more server systems that perform various functions according to various embodiments described herein. These components may be executable, intermediate (e.g., IL) or interpreted (e.g., Java) code which communicate over a communication network (e.g., the Internet) using a communication protocol (e.g., TCP/IP). For example, one or more database servers may be used to store device data that is used in designing layouts, and one or more servers may be used to efficiently perform cooling calculations associated with embodiments described herein.

Aspects and embodiments described herein are not limited to executing on any particular system or group of systems. The aspects and embodiments described herein are not limited to any particular distributed architecture, network, or communication protocol.

Various aspects and embodiments may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects and embodiments may be implemented in a non-programmed environment (e.g., documents created in HTML, XML or other format that, when viewed in a window of a browser program, render aspects of a graphical-user interface (GUI) or perform other functions). Various aspects and embodiments may be implemented as programmed or non-programmed elements, or any combination thereof.

Systems and methods are described herein that provide indications of remaining cooling capacity for equipment enclosures. The indication of remaining cooling capacity may be a direct indication of remaining cooling in terms of, for example, kilowatts or BTU per hour, or the indication may be indirect such as providing the total capacity of cooling available to an enclosure along with an indication of how much cooling is being used, for example, in terms of percentage. Further, calculated values, including the capture index and the recirculation index may be used to determine the sufficiency of a particular design and to determine additional cooling capacity before a warning or error condition will result.

In aspects and embodiments discussed herein, results of analyses are described as being provided in real-time. The term real-time may, but need not suggest that the results are available immediately. For example, results may become outdated quickly, giving a designer the ability to try a number of different designs over a short period of time, such as a matter of minutes.

Note that in FIGS. 1 through 11, the enumerated items are shown as individual elements. In actual implementations of the systems and methods described herein, however, they may be inseparable components of other electronic devices such as a digital computer. Thus, actions described above may be implemented at least in part in software that may be embodied in an article of manufacture that includes a program storage medium. The program storage medium includes data signals embodied in one or more of a carrier wave, a computer disk (magnetic, or optical (e.g., CD or DVD, or both), non-volatile memory, tape, a system memory, and a computer hard drive.

Aspects and embodiments described herein afford effective data center control. These aspects and embodiments are able to receive information about cooling units, racks, servers, and applications. The received information includes rack power consumption, cooling unit power consumption, utilization rates of racks and cooling units, application requirements, rack and server computing capacity information, and rack based cooling metric thresholds such as capture index thresholds. By evaluating these characteristics, aspects and embodiments include determining a layout of the data center that minimizes total power consumption of a cluster of racks and cooling units while maintaining cooling performance at an acceptable level based on the cooling metrics. The determined layout of data center components and workload increases data center efficiency and compatibility, saves energy, and lowers operating cost. These aspects and embodiments can occur in real time. For example, the performance of assessments and calculations in real time refers to processes that are completed in a matter of a few seconds or less rather than several minutes or longer as can happen with complex calculations, such as those involving computational fluid dynamics (CFD) calculations.

Embodiments and aspects described herein are suitable for use in relatively large data centers having numerous equipment racks, as well as smaller or informal data centers and with facilities other than data centers. Estimations of branch circuit capacities and phase balance can become complex in high density data centers. Internal server power instrumentation may provide information to a data center controller to identify cooling subsystem capacity. In various embodiments, such as those utilizing three phase power supplies or where server instrumentation is lacking, power distribution system instrumentation can provide information used to determine load consumption, available capacities, and phase balance. This information can be used by a data center controller to allocate or reallocate data center devices, subsystems, or equipment to or within one or more data centers. This improves data center operation and efficiency, and lowers operating cost.

Any references to front and back, left and right, top and bottom, and upper and lower are intended for convenience of description, not to limit the present systems and methods or their components to any one positional or spatial orientation.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements.

Any embodiment disclosed herein may be combined with any other embodiment, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. Such terms as used herein are not necessarily all referring to the same embodiment. Any embodiment may be combined with any other embodiment in any manner consistent with the objects disclosed herein. References to "or" may be construed as inclusive so that any terms described using "or" may indicate any of a single, more than one, and all of the described terms.

Where technical features in the drawings, detailed description or any claim are followed by references signs, the reference signs have been included for the sole purpose of increasing the intelligibility of the drawings, detailed description, and claims. Accordingly, neither the reference signs nor their absence have any limiting effect on the scope of any claim elements.

One skilled in the art will realize the systems and methods described herein may be embodied in other specific forms without departing from the spirit or essential characteristics thereof. For example, physically separate data centers in geographically disparate areas may be considered to be one distributed data center. In another example, resources may be allocated or adjusted between one or more devices or subsystems of a single data center. Further, rack and cooling unit power consumption, cooling constraints, utilization rates, computing capacities, and cooling metrics can include estimates or simulations, and need not be actual measured values. Cooling metrics can be rack based or non rack based. For example, cooling metrics can be based on areas of a data center independent of the location of one or more racks. Cooling units can be row based or room based. Acts and elements described herein can occur in real time. The foregoing embodiments are therefore to be considered in all respects illustrative rather than limiting of the described systems and methods. Scope of the systems and methods described herein is thus indicated by the appended claims, rather than the foregoing description, and all changes that come within the meaning and range of equivalency of the claims are therefore intended to be embraced therein.

What is claimed is:

1. A computer implemented method of data center control, the data center including a plurality of racks and at least one cooling unit, the racks including at least one server, the method comprising:
   receiving information regarding the at least one cooling unit, the at least one server, the plurality of racks, and at least one application, the information including workload of the data center;
   receiving a rack based cooling metric threshold;
   determining, by a computer system, a first layout based on the information that can process the workload of the data center, while maintaining cooling performance at an acceptable level based on the cooling metric threshold; and
   modifying, by the computer system, the first layout of the data center by determining a second layout that minimizes a total power consumption of the plurality of racks while maintaining cooling utilization rates of the at least one cooling unit below a first threshold, rack utilization rates of each of the plurality of racks below a second threshold, and while maintaining the cooling performance at the acceptable level based on the cooling metric threshold.

2. The method of claim 1, comprising:
   determining a workload distribution of the at least one application between a plurality of servers that satisfies the rack based cooling metric threshold.

3. The method of claim 1, wherein the rack based cooling metric threshold includes at least one of a hot aisle capture index threshold and a cold aisle capture index threshold, comprising:
   determining at least one of a hot aisle capture index and a cold aisle capture index;

determining, in real time, at least one of the hot aisle capture index threshold and the cold aisle capture index threshold; and distributing the at least one application to the at least one server based on at least one of the hot aisle capture index threshold and the cold aisle capture index threshold.

4. The method of claim 1, comprising:

determining individual power consumption of each of the plurality of racks based on the rack utilization rate of each of the plurality of racks;

determining power consumption of the at least one cooling unit based on the cooling utilization rate of the at least one cooling unit;

determining the total power consumption of the plurality of racks and of the at least one cooling unit; and determining the second layout of the data center based on the total power consumption, the power consumption of each of the plurality of racks, and the power consumption of the at least one cooling unit.

5. The method of claim 1, comprising:

determining, in real time, the total power consumption of the data center based on at least one of the rack utilization rate of each of the plurality of racks and the cooling utilization rate of the at least one cooling unit;

distributing the workload between a plurality of servers and cooling load between a plurality of cooling units while maintaining cooling performance at the acceptable level based on the cooling metric threshold.

6. The method of claim 1, comprising:

distributing the at least one application from the at least one server to a second server of a second rack, wherein the second rack is located in one of the data center and a second data center.

7. The method of claim 1, comprising:

providing instructions to relocate a first rack of the plurality of racks within the data center.

8. The method of claim 1, comprising:

displaying at least one of the first layout and the second layout of the data center.

9. A data center control system of a data center including a plurality of racks and at least one cooling unit, the plurality of racks including at least one server, the system comprising:

a data center controller configured to:

receive information regarding the at least one cooling unit, the at least one server, the plurality of racks, and at least one application, the information including workload of the data center;

receive a rack based cooling metric threshold;

determine a first layout based on the information that can process the workload of the data center, while maintaining cooling performance at an acceptable level based on the cooling metric threshold; and modify the first layout of the data center by determining a second layout that minimizes a total power consumption of the plurality of racks while maintaining cooling utilization rates of the at least one cooling unit below a first threshold, rack utilization rates of each of the plurality of racks below a second threshold, and while maintaining the cooling performance at the acceptable level based on the cooling metric threshold.

10. The system of claim 9, wherein the data center controller is configured to:

determine a workload distribution of the data center; and distribute the workload from the at least one server to a second server.

11. The system of claim 9, wherein the rack based cooling metric threshold includes at least one of a hot aisle capture index threshold and a cold aisle capture index threshold, and wherein the data center controller is configured to:

determine at least one of a hot aisle capture index and a cold aisle capture index;

determine at least one of the hot aisle capture index threshold and the cold aisle capture index threshold; and distribute the at least one application to the at least one server based on at least one of the hot aisle capture index threshold and the cold aisle capture index threshold.

12. The system of claim 9, wherein the data center controller is configured to:

determine individual power consumption of each of the plurality of racks based on the rack utilization rate of each of the plurality of racks;

determine power consumption of the at least one cooling unit based on the cooling utilization rate of the at least one cooling unit;

determine the total power consumption of the plurality of racks and of the at least one cooling unit; and determine the second layout of the data center based on the total power consumption, the power consumption of each of the plurality of racks, and the power consumption of the at least one cooling unit.

13. The system of claim 9, wherein the data center controller is configured to:

determine total power consumption of a cluster of the data center, the cluster including the plurality of racks and the at least one cooling unit; and identify a workload distribution of the cluster that minimizes the total power consumption.

14. The system of claim 9, wherein the data center controller is configured to:

determine total power consumption of the data center based on at least one of the rack utilization rate of at least one of the plurality of racks and the cooling utilization rate of the at least one cooling unit; and distribute the workload between a plurality of servers while maintaining cooling performance at the acceptable level based on the cooling metric threshold.

15. The system of claim 9, wherein the data center controller is configured to transfer the at least one application from the at least one server to a second server.

16. The system of claim 9, wherein the at least one cooling unit includes an in-row cooling unit.

17. A non-transitory computer readable medium having stored thereon sequences of instruction including instructions that cause a processor to:

receive information regarding the at least one cooling unit, the at least one server, the plurality of racks, and at least one application, the information including workload of the data center;

receive a rack based cooling metric threshold;

determine a first layout based on the information that can process the workload of the data center, while maintaining cooling performance at an acceptable level based on the cooling metric threshold; and modify the first layout of the data center by determining a second layout that minimizes a total power consumption of the plurality of racks while maintaining cooling utilization rates of the at least one cooling unit below a first threshold, rack utilization rates of each of the plurality of racks below a second threshold, and while maintaining the cooling performance at the acceptable level based on the cooling metric threshold.

18. The non-transitory computer readable medium of claim 17, comprising instructions that cause the processor to:
- determine at least one of a hot aisle capture index and a cold aisle capture index;
- determine at least one of a hot aisle capture index threshold and a cold aisle capture index threshold; and
- distribute the at least one application to the at least one server based on at least one of the hot aisle capture index threshold and the cold aisle capture index threshold.

19. The non-transitory computer readable medium of claim 17, comprising instructions that cause the processor to:
- determine individual power consumption of each of the plurality of racks based on the rack utilization rate of each of the plurality of racks;
- determine power consumption of the at least one cooling unit based on the cooling utilization rate of the at least one cooling unit;
- determine the total power consumption of the plurality of racks and of the cooling unit; and
- determine the second layout of the data center based on the total power consumption, the power consumption of each of the plurality of racks, and the power consumption of the at least one cooling unit.

20. The non-transitory computer readable medium of claim 17, comprising instructions that cause the processor to:
- distribute the at least one application from a first server of a first rack of the plurality of racks to a second server of a second rack of the plurality of racks.

* * * * *